(12) United States Patent
Kitagawa et al.

(10) Patent No.: US 8,335,117 B2
(45) Date of Patent: Dec. 18, 2012

(54) MEMORY DEVICE WITH INHIBIT CONTROL SECTIONS

(75) Inventors: Makoto Kitagawa, Kanagawa (JP); Tsunenori Shiimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 162 days.

(21) Appl. No.: 12/656,002

(22) Filed: Jan. 13, 2010

(65) Prior Publication Data

US 2010/0214818 A1    Aug. 26, 2010

(30) Foreign Application Priority Data

Feb. 26, 2009    (JP) ................................. 2009-044225

(51) Int. Cl.
*G11C 7/00*    (2006.01)
(52) U.S. Cl. ........ 365/195; 365/196; 365/148; 365/207; 365/158; 365/163
(58) Field of Classification Search ................... 365/148, 365/158, 161, 163, 171, 173, 130, 131, 160, 365/195, 196, 207

See application file for complete search history.

(56) References Cited

U.S. PATENT DOCUMENTS

| | | | |
|---|---|---|---|
| 7,088,630 B2 * | 8/2006 | Hung et al. ................. | 365/185.2 |
| 7,564,718 B2 * | 7/2009 | Seidel et al. ............. | 365/185.28 |
| 7,742,341 B2 * | 6/2010 | Kim et al. ................. | 365/185.22 |
| 2007/0139987 A1 * | 6/2007 | Kouchiyama et al. ............ | 365/1 |

FOREIGN PATENT DOCUMENTS

| | | |
|---|---|---|
| JP | 05-144277 | 6/1993 |
| JP | 2007-133930 | 5/2007 |

OTHER PUBLICATIONS

K. Aratani, et al., "A Novel Resistance Memory with High Scalability and Nanosecond Switching," Technical Digest IEDM 2007, pp. 783-786, Kanagawa, Japan.

* cited by examiner

*Primary Examiner* — Kretelia Graham
(74) *Attorney, Agent, or Firm* — Rader Fishman & Grauer, PLLC

(57) ABSTRACT

Disclosed herein is a memory device including: first and second wires; memory cells including a variable-resistance storage element having a data storage state making a transition by a change of a voltage applied and an access transistor connected in series between the first and second wires; driving control sections controlling a direct verify sub-operation by applying a write/erase pulse between the first and second wires in a data write/erase operation respectively for causing a cell current to flow between the first and second wires through the memory cell for a transition of the data storage state; sense amplifiers sensing an electric-potential change occurring on the first wire in accordance with control on the direct verify sub-operation; and inhibit control sections determining whether or not to inhibit a sense node of the sense amplifier from electrically changing at the next sensing time on the basis of an electric potential appearing at the sense node at the present sensing time.

12 Claims, 19 Drawing Sheets

MEMORY DEVICE WITH INHIBIT CONTROL SECTIONS

BACKGROUND OF THE INVENTION

1. Field of the Invention

The present invention relates to a memory device employing memory cells each including a variable-resistance storage element which has a resistance changing in accordance with a voltage applied to the variable-resistance storage element and is connected in series to an access transistor, and relates to a method for operating the memory device.

2. Description of the Related Art

There has been already known a memory device employing memory cells each including a variable-resistance storage element which has a resistance changing due to injection of conductive ions into an insulation film of the variable-resistance storage element or due to extraction of such ions from the insulation film. For more information on this memory device, the reader is suggested to refer to a document such as K. Aratani etc., "A Novel Resistance-type memory with High Scalability and Nanosecond Switching," Technical Digest IEDM 2007, pp. 783-786.

The variable-resistance storage element has a laminated structure constructed by creating a conductive-ion supplying layer and the insulation film cited above between two electrodes of the variable-resistance storage element.

Every memory cell employs a variable-resistance storage element and an access transistor which are connected to each other in series between first and second common lines drivable in an active matrix driving operation. Since the memory cell employs a transistor (T) and a variable-resistance resistor (R), the memory cell is referred to as a 1T1R-type memory cell.

The memory device employing 1T1R-type memory cells is referred to as a ReRAM.

In the ReRAM, the resistance of a variable-resistance storage element is used to indicate a state in which data has been stored in the variable-resistance storage element or a state in which data has been erased from the variable-resistance storage element. That is to say, the resistance of a variable-resistance storage element indicates the value of data stored in the variable-resistance storage element. A data write operation to store data in a variable-resistance storage element and a data erase operation to erase data from a variable-resistance storage element can be carried out by applying a pulse having a small width of the order of some ns (nanoseconds) to the variable-resistance storage element. Thus, since the ReRAM is an NVM (non-volatile memory) capable of operating at as high a speed as a RAM (Random Access Memory), the ReRAM draws much attention.

In order for the ReRAM to serve as a substitute for a flash memory which is the contemporary NVM of the FG (Floating Gate)_NAND type, however, it is necessary for the ReRAM to surmount several barriers. Some of the barriers are requirements for a high-speed verify sub-operation and high-speed inhibit control which need to be carried out in the data write and erase operations as described below. In this specification of the present invention, in case it is not necessary to distinguish the data write operation and the data erase operation from each other, both the data write and erase operations are referred to as a data update operation which is a generic technical term for them.

In the data update operation, a verify sub-operation is carried out after a data transition sub-operation. The data-transition sub-operation is carried out prior to the verify sub-operation by application of an update (that is, write or erase) pulse to a variable-resistance storage element in order to update data which has been stored in the variable-resistance storage element. On the other hand, the verify sub-operation is carried out in order to determine whether or not the data serving as an update has been stored in a variable-resistance storage element correctly by the application of the update pulse to the variable-resistance storage element.

The inhibit control is executed right after the verify sub-operation in order to assure that the data update operation has been carried out correctly, that is, in order to prevent (or inhibit) the data update operation from resulting in incorrect data stored as a result of the data update operation. That is to say, the inhibit control is control executed in order to avoid a transfer of unintended data as an update to the variable-resistance storage element of the memory cell in the data update operation which is carried out to gradually update (that is, write or erase) data stored in the variable-resistance storage element by repeating the data transition sub-operation consecutively a plurality of times. To put it in detail, if a determination result produced in the verify sub-operation indicates that data serving as an update has been transferred to the variable-resistance storage element correctly, the inhibit control is control executed in order to prevent an additional update pulse from being applied to the variable-resistance storage element and another data transition sub-operation from being carried out as a part of the data update operation. If the determination result produced in the verify sub-operation indicates that data serving as an update has not been transferred to the variable-resistance storage element correctly, on the other hand, the inhibit control is control executed so as to apply an additional update pulse to the variable-resistance storage element in order to carry out another data transition sub-operation as a part of the data update operation to update data correctly.

The control described above is a method adopted by a number of NVMs.

As is obvious from the above description, a data update operation includes a data transition sub-operation, a verify sub-operation and inhibit control. The technical term 'verify sub-operation' is deliberately used in this specification of the present invention to imply a data read sub-operation carried out after a data transition sub-operation in order to distinguish the data read sub-operation carried out after a data transition sub-operation from a normal data read operation.

Much like other NVMs, the ReRAM also allows high operation reliability to be implemented by executing inhibit control right after each verify sub-operation in accordance with the determination result produced in the verify sub-operation.

In the ReRAM, the direction of a current flowing in a data read operation to read out data from the variable-resistance storage element is the same as the direction of a current flowing in a data update (that is, write or erase) operation. By the way, a disturbance is a fault caused by mistakenly updating data stored in the variable-resistance storage element during a data read operation. Thus, in order to prevent the disturbance from occurring in a data read operation, it is necessary to read out data in the data read operation from the variable-resistance storage element of the memory cell employed in the ReRAM by applying a deliberately decreased voltage to the variable-resistance storage element. That is to say, in general, the inhibit control of the data update operation is executed by changing the voltage applied to the variable-resistance storage element to a magnitude different from that used in the data read operation.

There has been disclosed a method for carrying out a verify sub-operation preceding inhibit control which is executed by changing the voltage applied to the variable-resistance storage element. In accordance with this method, an electric potential applied to a bit line BL (that is, an electric potential appearing on the bit line BL) is once initialized after application of an update pulse in order to again apply a BL (bit line) voltage optimum for the verify sub-operation to the bit line BL. For more information on this method, the reader is suggested to refer to a document such as Japanese Patent Laid-open No. Hei 5-144277 (hereinafter referred to as Patent Document 1).

That is to say, in order to carry out the verify sub-operation, the electric potential appearing on the bit line BL is initialized in order to change a voltage applied to the variable-resistance storage element of the NVRAM from the magnitude of the update pulse for the data update operation to a magnitude optimum for the verify sub-operation.

In addition, in accordance with the method disclosed in Patent Document 1, the verify sub-operation and the inhibit control are executed independently of each other for each column (or each sense amplifier). Thus, the method is suitable for parallel operations.

There has been disclosed a method in accordance with which residual electric charge remaining on the bit line BL after application of an update pulse is discharged through the memory cell and a voltage change obtained as a result of the electrical discharge process is detected. For more information on this method, the reader is suggested to refer to a document such as Japanese Patent Laid-open No. 2007-133930 (hereinafter referred to as Patent Document 2).

In accordance with the method disclosed in Patent Document 2, the verify sub-operation is carried out without waiting for time to lapse since the application of an update pulse having a relatively high voltage. That is to say, the verify sub-operation is carried out by applying a relatively high voltage, which may cause a read disturbance, to the variable-resistance storage element of a memory cell.

However, such a high voltage is applied to a memory cell only in a verify sub-operation and a disturbance stress matches an update stress. Thus, no problem is raised.

In addition, since the verify sub-operation is carried out without waiting for time to lapse since the application of an update pulse, the verify sub-operation can be completed in a short period of time.

On top of that, a voltage for electrically pre-charging the bit line BL in a verify sub-operation is high, the S/N (signal to noise) ratio can be sustained at a high value. Thus, the stability of the verify sub-operation is good.

SUMMARY OF THE INVENTION

In accordance with the method disclosed in Patent Document 1, since the verify sub-operation is carried out after waiting for time to lapse since the application of an update pulse, the method is not suitable for high-speed applications.

In accordance with the method disclosed in Patent Document 2, it is possible to avoid an operation-speed decrease caused by the wait time.

However, Patent Document 2 does not describe a technique for applying a next additional update pulse in accordance with a determination result produced by the verify sub-operation. That is to say, there has been proposed neither a concrete control method capable of executing the inhibit control surely, at a high speed and with a high degree of operating reliability in accordance with a determination result produced by the verify sub-operation nor a configuration for implementing the method.

Inventors of the present invention have innovated a memory device including a circuit capable of executing the inhibit control with a high degree of reliability and at a high speed in accordance with a determination result produced by a verify sub-operation.

A memory device provided by an embodiment of the present invention employs a first wire and a second wire, memory cells, driving control sections, sense amplifiers and inhibit control sections.

In each of the memory cells, a variable-resistance storage element recording data storage state is connected in series to an access transistor between the first and second wires.

Each of the driving control sections applies a write pulse or an erase pulse between the first and second wires in a data write operation or a data erase operation respectively and consecutively executes a direct verify sub-operation by causing a cell current to flow between the first and second wires through the memory cell.

That is to say, the driving control section is capable of causing a transition of the data storage state in either one of two directions by controlling the voltage of the write (or erase) pulse applied between the first and second wires.

In addition, the driving control section changes a voltage state on the first wire from a state in which a voltage with a magnitude capable of causing a transition of the data storage state is being applied to the first wire to typically a high-impedance state in which the first wire has a high impedance consecutively. In this way, electric charge can be electrically discharged through the memory cell for a fixed period of time or electric charge having an opposite polarity can be electrically charged to the first wire in the state in which the aforementioned voltage is being applied to the first wire.

Each of the sense amplifiers senses an electric-potential change occurring on the first wire in accordance with control executed by the driving control section after a direct verify sub-operation to be described below.

Each of the inhibit control sections determines whether or not to inhibit the sense node of the sense amplifier from electrically changing at the next sensing time on the basis of an electric potential which appears at the sense node at the present sensing time.

In accordance with the configuration described above, it is possible to carry out a verify sub-operation to read out data in order to verify the data directly, that is, by keeping a voltage used in an operation to update (that is, write or erase) the data in a state of being applied to the first wire as it is. Such a verify sub-operation is referred to as a direct verify sub-operation.

In addition, as described above, the inhibit control section determines whether or not to inhibit the sense node of the sense amplifier from electrically changing at the next sensing time in accordance with a determination result produced in the direct verify sub-operation, that is, in accordance with an electric potential appearing at the sense node at the present sensing time as an electric potential resulting from the direct verify sub-operation. Thus, even if an additional update (that is, write or erase) pulse is applied after a pass (or success) result of determination has been produced in the direct verify sub-operation, there is not a malfunction which results in an unintended data change at the sense node of the sense amplifier.

An operation method of the memory device including a variable-resistance storage element formed between first and second wires provided by another embodiment of the present invention includes the following three steps.

(1): A step of applying a write or erase pulse to the variable-resistance storage element via the first and second wires.

(2): A step of putting the first wire in a high impedance state with the write or erase pulse applied to the variable-resistance storage element and driving the sense amplifier to sense an electrical change occurring on the first wire due to a current flowing through the variable-resistance storage element in order to produce a result of determination in a direct verify sub-operation which is carried out as a part of a data update operation.

(3): A step of executing inhibit control of detecting an electric potential appearing at a sense node of the sense amplifier at a read time of the direct verify sub-operation in order to produce a result of detection and setting a state of inhibiting the sense node from electrically changing at a read time of the next direct verify sub-operation on the basis of the result of detection.

In accordance with the embodiment of the present invention, it is possible to provide a memory device including a circuit capable of executing the inhibit control with a high degree of reliability and at a high speed in accordance with a determination result produced in a direct verify sub-operation.

In addition, in accordance with another embodiment of the present invention, it is possible to provide a method for operating a memory device including a circuit capable of executing the inhibit control with a high degree of reliability and at a high speed in accordance with a determination result produced in a direct verify sub-operation.

BRIEF DESCRIPTION OF THE DRAWINGS

These and other innovations as well as features of the present invention will become clear from the following description of preferred embodiments given with reference to accompanying diagrams, in which:

FIGS. 12A to 12O2 are a timing diagram showing waveforms each representing a timing chart of a signal used in a data set operation which is carried out in accordance with the first embodiment;

FIGS. 13A to 13O2 are a timing diagram showing waveforms each representing a timing chart of a signal used in a data reset operation which is carried out in accordance with the first embodiment;

FIGS. 14A to 14O2 are a timing diagram showing waveforms each representing a timing chart of a signal used in a data read operation which is carried out in accordance with the first embodiment;

FIGS. 17A to 17M2 are a timing diagram showing waveforms each representing a timing chart of a signal used in a data set operation which is carried out in accordance with the second embodiment;

FIGS. 18A to 18M2 are a timing diagram showing waveforms each representing a timing chart of a signal used in a data reset operation which is carried out in accordance with the second embodiment;

FIGS. 19A to 19M2 are a timing diagram showing waveforms each representing a timing chart of a signal used in a data read operation which is carried out in accordance with the second embodiment;

DETAILED DESCRIPTION OF THE PREFERRED EMBODIMENTS

Preferred embodiments of the present invention are explained by referring to the diagrams in chapters which are arranged as follows:

1: First Embodiment

The first embodiment implements a configuration in which a (verify-pass) latch circuit 74 is provided at a location in close proximity to a sense amplifier. FIGS. 10 to 14 are referred to in the explanation of the first embodiment.

2: Second Embodiment

The second embodiment implements a configuration in which the (verify pass) latch circuit 74 is not created at a location in close proximity to a sense amplifier, but replaced by an external logic circuit which serves as a substitute for the latch. FIGS. 15 to 19 are referred to in the explanation of the second embodiment.

3: First Modified Version

Figure 20:
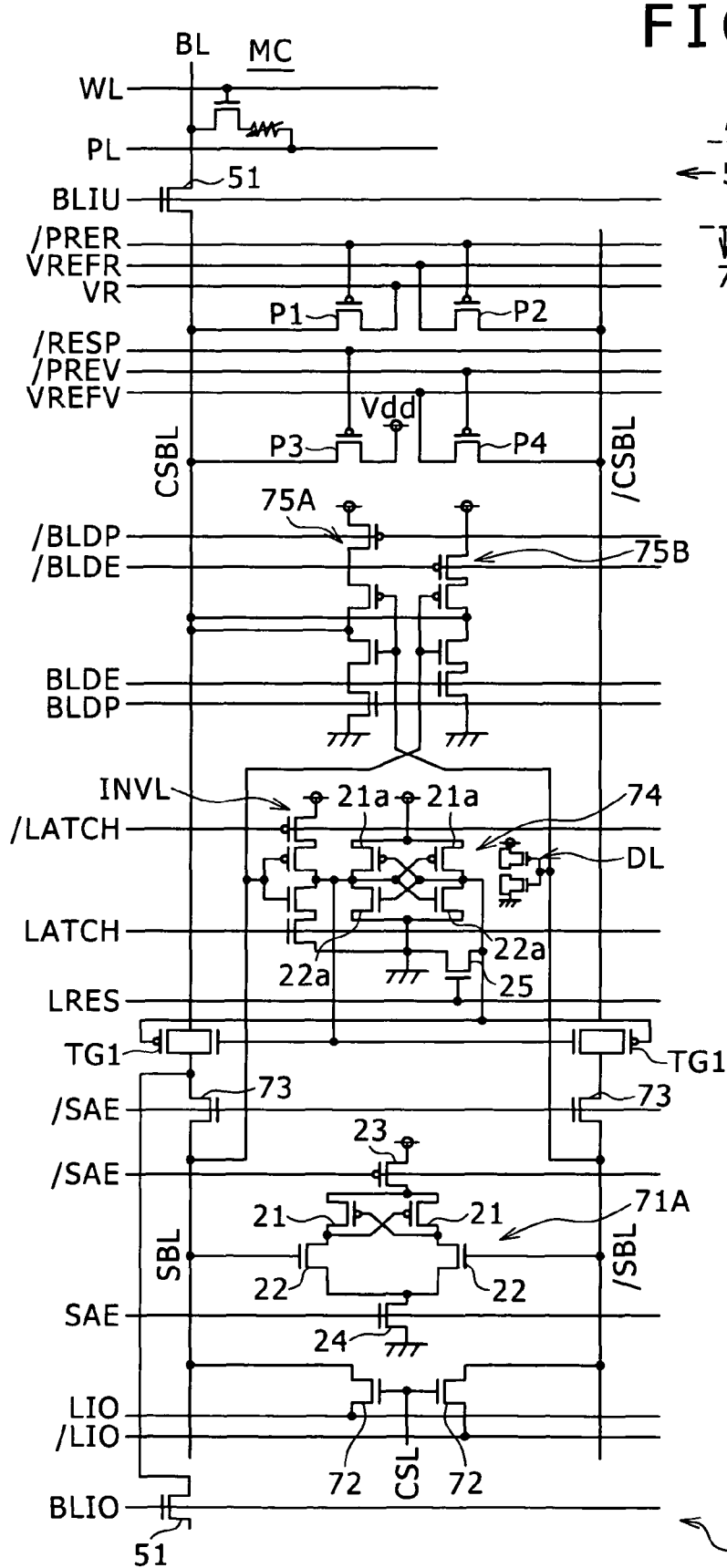
FIG. 20 is a circuit diagram showing the configuration of a column circuit employing a sense latch circuit in accordance with a first modified version.

As shown in a circuit diagram of FIG. 20, a first modified version has a configuration including a sense latch circuit 71A which employs two MOS transistors 22 which each have a MOS gate serving as an input terminal.

4: Second Modified Version

Figure 21:
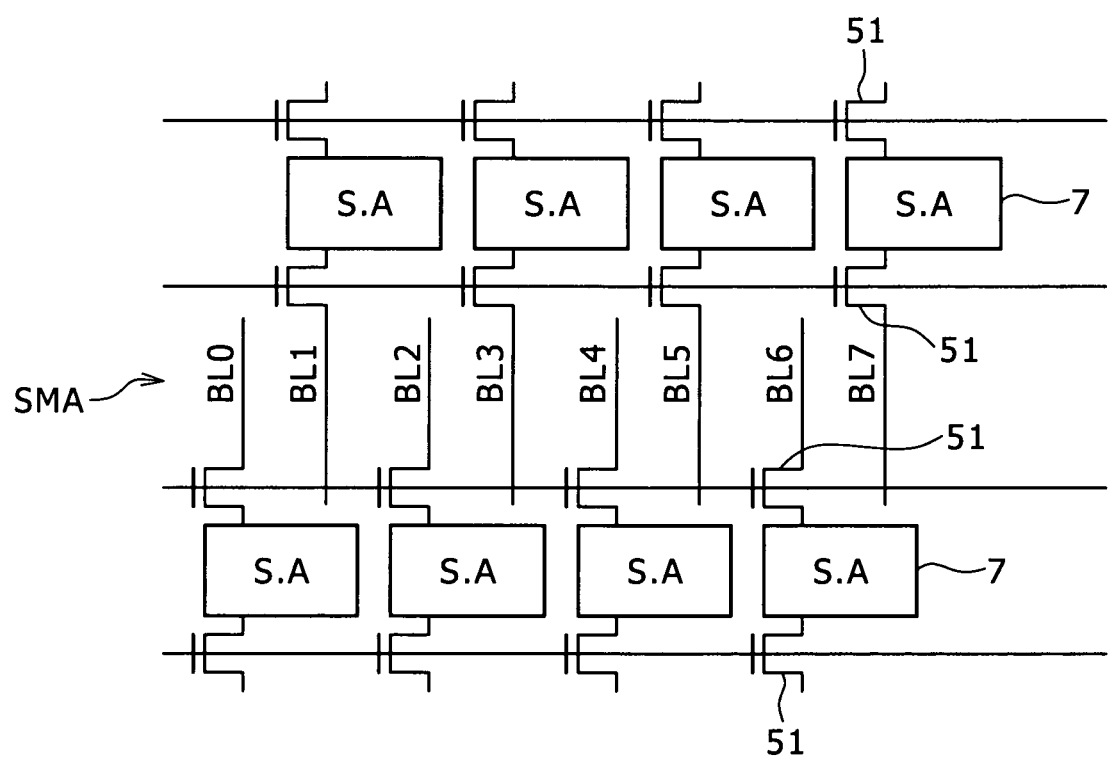
FIG. 21 is a wiring diagram of SAs (sense amplifiers) which are wired in accordance with a second modified version.
Figure 22:
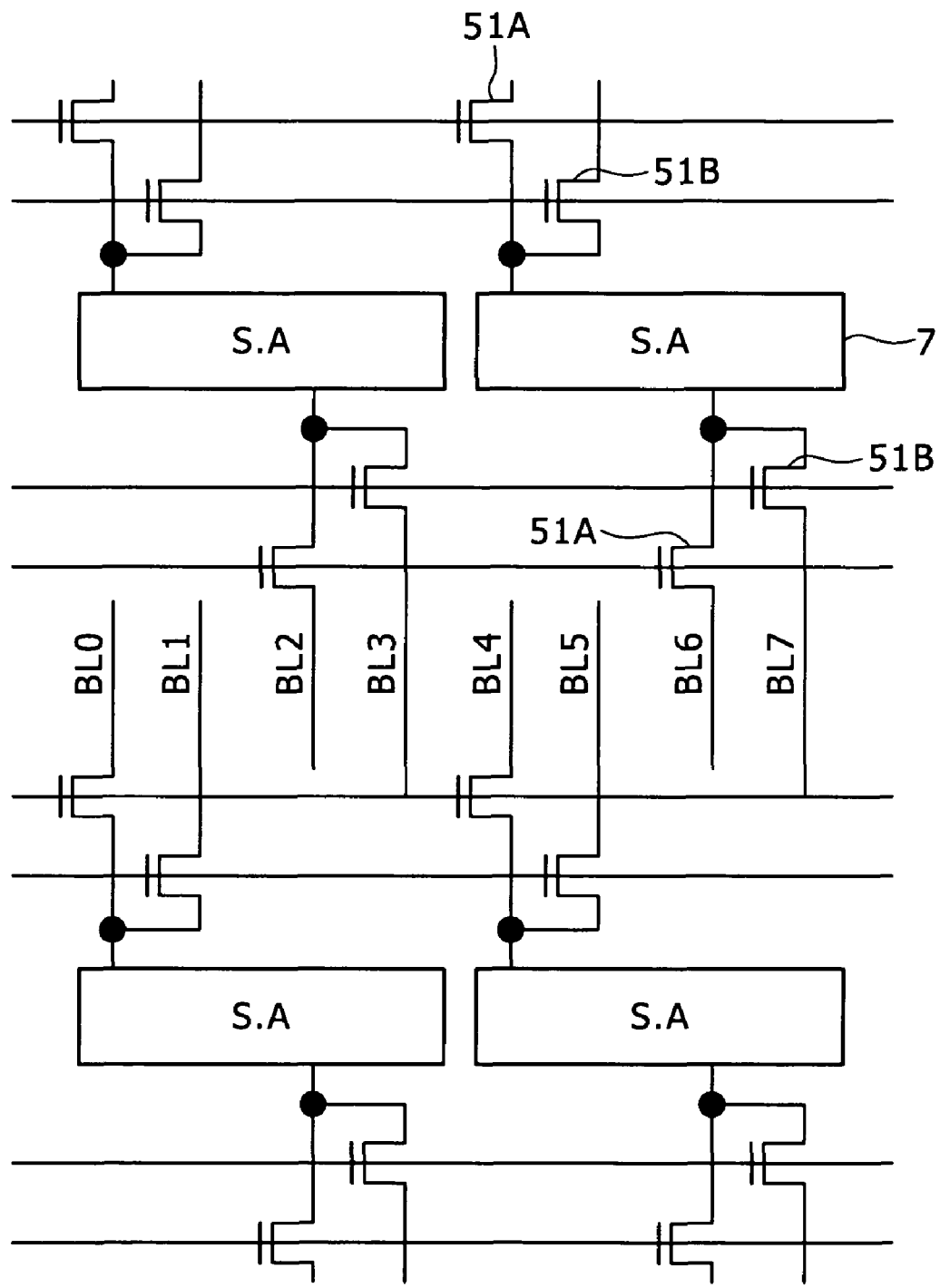
FIG. 22 is a wiring diagram of SAs which are wired in another way according to the second modified version.

As shown in diagrams of FIGS. 21 and 22, a second modified version implements typical wiring of SAs (sense amplifiers).

1: First Embodiment

Memory-Cell Configuration

Figure 1A:
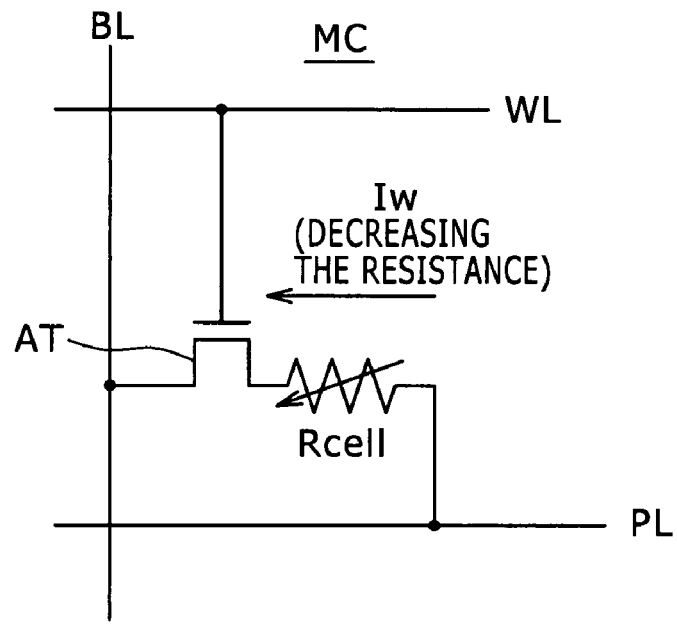
FIGS. 1A and 1B are a plurality of circuit diagrams each showing an equivalent circuit of a memory cell which is common to first and second embodiments implementing a memory device including the memory cell as well as modified versions of the embodiments.
Figure 1B:
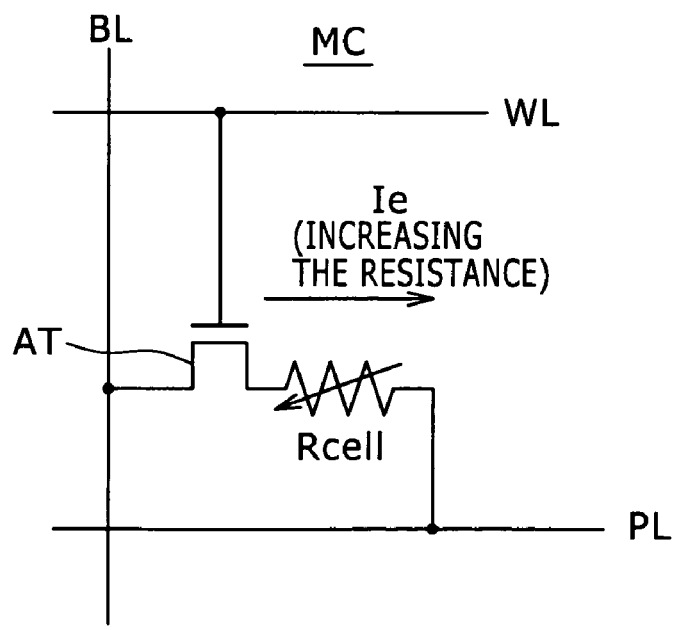

FIGS. 1A and 1B are a plurality of circuit diagrams each showing an equivalent circuit of a memory cell MC which is common to first and second embodiments as well as modified versions of the embodiments. It is to be noted that, even though FIG. 1A is a circuit diagram showing a write current Iw flowing in the equivalent circuit of the memory cell MC whereas FIG. 1B is a circuit diagram showing an erase current Ie flowing in the equivalent circuit of the memory cell MC in a direction opposite to the direction of the write current Iw, the memory-cell configuration shown in the circuit diagram of FIG. 1A is identical with the memory-cell configuration shown in the circuit diagram of FIG. 1B.

Each of the memory cells MCs shown in the circuit diagrams of FIGS. 1A and 1B employs a variable-resistance cell resistor Rcell and an access transistor AT. The variable-resistance cell resistor Rcell functions as a variable-resistance storage element having a variable resistance.

One end of the variable-resistance resistor Rcell is connected to a plate line PL whereas the other end is connected to the source of the access transistor AT. The drain of the access transistor AT is connected to a bit line BL whereas the gate of the access transistor AT is connected to a word line WL which is used as an access line.

The bit line BL is a typical example of the first wire whereas the plate line PL is a typical example of the second wire. It is to be noted that, even though the bit line BL and the plate line PL are oriented in directions perpendicular to each other in the diagram of FIGS. 1A and 1B, the bit line BL and the plate line PL can be actually oriented in directions parallel to each other.

Figure 2:
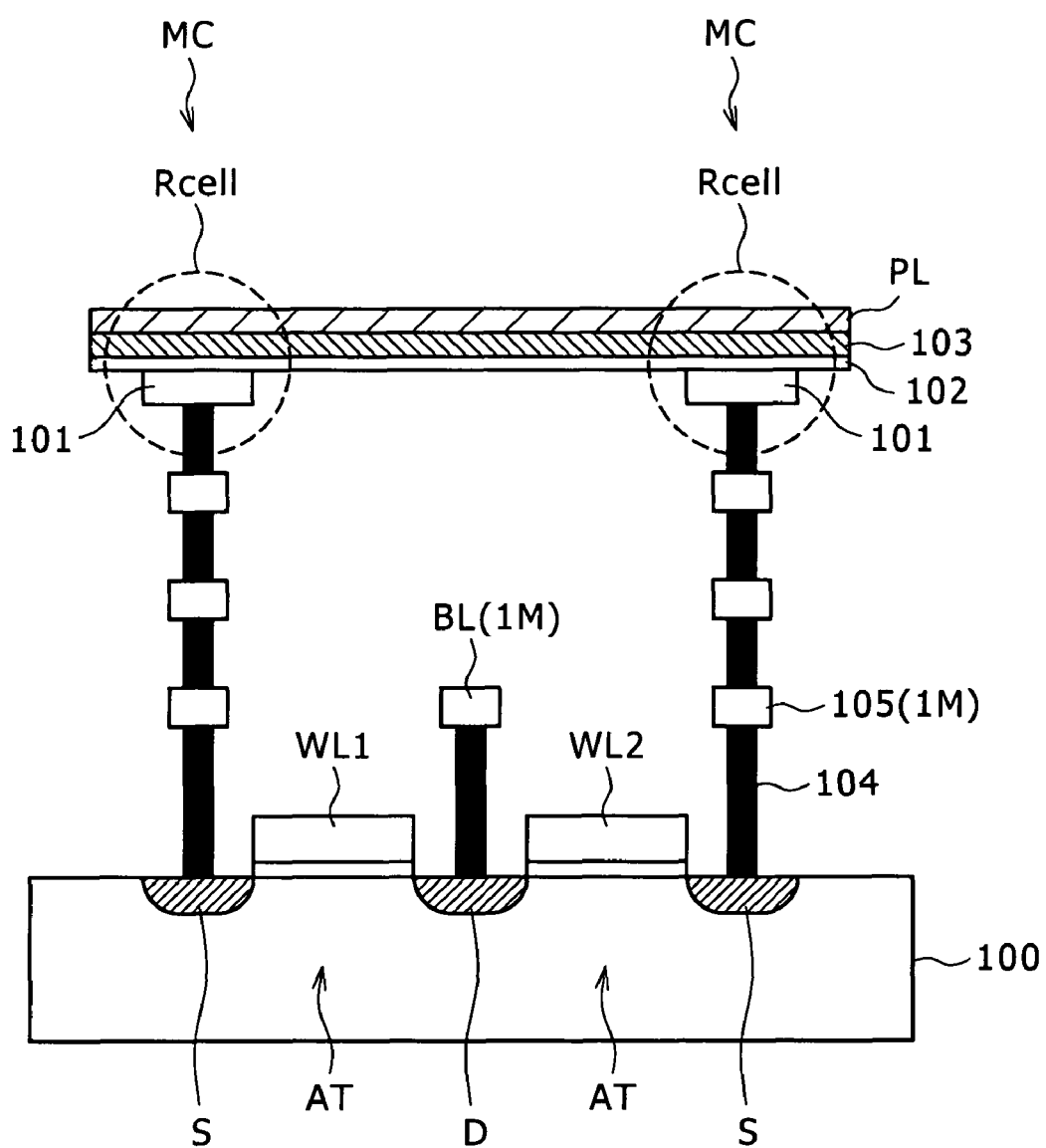
FIG. 2 is a diagram showing a cross section of two adjacent memory cells included in the memory device.

FIG. 2 is a diagram showing a cross section of two adjacent memory cells MC included in a memory device. To be more specific, FIG. 2 is a diagram showing a cross section of a model which represents two adjacent memory cells and includes no hatched portions except the plate line PL. In particular, each of blank portions shown in the cross-sectional diagram of FIG. 2 as portions including nothing is filled with an insulation film or used as another component (or a part of the other component).

In each of the memory cells MC shown in the cross-sectional diagram of FIG. 2, the access transistor AT is created on a semiconductor substrate 100.

To put it in more detail, two impurity areas to be used as the source S of the access transistor AT and the drain D of the access transistor AT respectively are created on the semiconductor substrate 100. In a middle substrate area between the source S and the drain D, a gate electrode is created from a material such as polysilicon, being separated from the middle substrate area by a gate insulation film. The two gate electrodes each created in the memory cell MC serve as word lines WL1 and WL2 respectively.

The two access transistors AT in the two memory cells MC respectively share the same drain D which is connected to a bit line BL created as a first-wire layer 1M.

On the source S of the access transistor AT, a plug 104 and a landing pad 105 are heaped up repeatedly to form a stack. The landing pad 105 is typically a wire layer. On the stack, a variable-resistance cell resistor Rcell is created. The number of pairs each including a plug 104 and a landing pad 105 heaped up in the stack on which a variable-resistance cell resistor Rcell is created is determined arbitrarily. Typically, the number of such pairs is four or five.

The variable-resistance cell resistor Rcell is created between a lower electrode 101 and an upper electrode which serves as the plate line PL. The variable-resistance cell resistor Rcell has a film configuration including an insulation film 102 connected to the lower electrode 101 and a semiconductor film 103 connected to the plate line PL.

Typical examples of a material used for making the insulation film 102 are SiN, $SiO_2$ and $Gd_2O_3$.

On the other hand, typical examples of a material used for making the semiconductor film 103 are a metallic film, an alloy film and a metallic compound film. The metallic film is typically a film containing one or more metallic elements such as Cu, Ag and Zn. A typical example of the alloy film is an alloy film made of CuTe. It is to be noted that metallic elements other than Cu, Ag and Zn can also be used for making the semiconductor film 103 provided that each of the other metallic elements has a property allowing the metallic element to be ionized with ease. In addition, it is desirable to make use of at least one of S, Se and Te as an element to be combined with at least one of Cu, Ag and Zn. The semiconductor film 103 is created as a layer for supplying conductive ions.

Figure 3A:
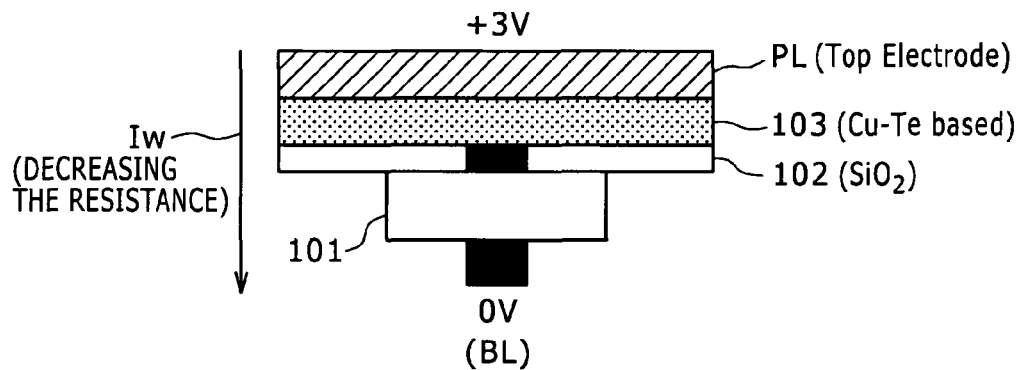
FIGS. 3A and 3B are a plurality of diagrams each showing a cross section of a variable-resistance cell resistor serving as a variable-resistance storage element employed in a memory cell and showing the operation of the variable-resistance storage element.
Figure 3B:
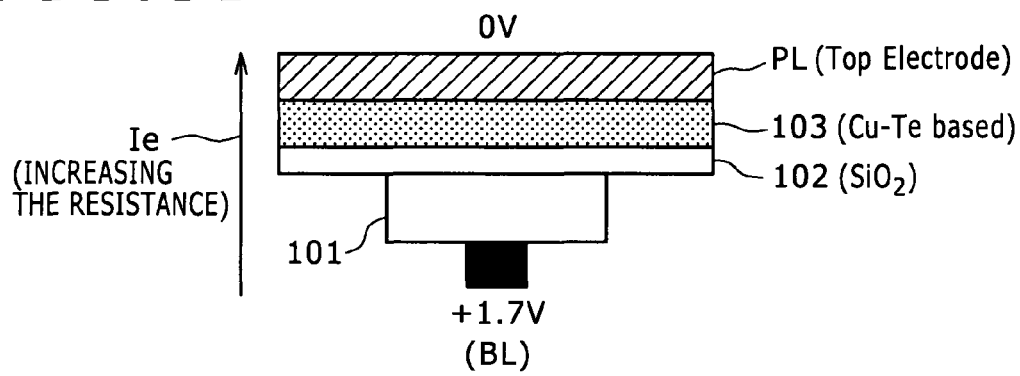

FIGS. 3A and 3B are a plurality of diagrams each showing an enlarged cross section of the variable-resistance cell resistor Rcell serving as a variable-resistance storage element and showing the operation of the variable-resistance storage element Rcell.

In each of the typical examples shown in the diagrams of FIGS. 3A and 3B, the insulation film 102 is created from $SiO_2$ whereas the semiconductor film 103 is made from a Cu—Te based alloy compound which is a compound based on a Cu—Te alloy.

In the cross-sectional diagram of FIG. 3A, a voltage is applied between the lower electrode 101 and the upper electrode, which serves as the plate line PL, in such a direction that the insulation film 102 and the semiconductor film 103 are used as a cathode and an anode respectively. For example, the bit line BL is connected to the ground GND having an electric potential of 0 V whereas the plate line PL receives an electric potential of +3 V.

Then, the variable-resistance cell resistor Rcell exhibits a characteristic allowing Cu, Ag and/or Zn which are included in the semiconductor film 103 to be ionized and attracted by the insulation film 102 serving as the cathode. Thus, the conductive ions of these metals are injected into the insulation film 102. Accordingly, the insulating characteristic of the insulation film 102 deteriorates, bringing about a conductive characteristic to the insulation film 102. As a result, a write current Iw flows in a direction indicated by an arrow shown in the cross-sectional diagram of FIG. 3A. This operation in which the write current Iw is flowing is referred to as a data write operation or a data set operation.

In a state shown in the cross-sectional diagram of FIG. 3B, on the other hand, a voltage is applied between the lower electrode 101 and the upper electrode, which serves as the plate line PL, in such a direction that the insulation film 102 and the semiconductor film 103 are used as an anode and a cathode respectively. For example, the bit line BL receives an electric potential of +1.7 V whereas the plate line PL is connected to the ground GND having an electric potential of 0 V.

Then, conductive ions injected into the insulation film 102 are returned to the semiconductor film 103 and the resistance of the variable-resistance cell resistor Rcell is reset to its original large value prevailing prior to the data write operation. In his state, an erase current Ie is flowing in a direction indicated by an arrow shown in the cross-sectional diagram of FIG. 3B. This operation in which the erase current Ie is flowing is referred to as an data erase operation or a data reset operation.

It is to be noted that, in general, the data set operation is an operation to sufficiently inject conductive ions into the insulation film 102 in order to establish a set state whereas the data reset operation is an operation to sufficiently extract conductive ions from the insulation film 102 in order to establish a reset state.

On the other hand, it is possible to arbitrarily select a set or reset state as a written-data state or an erased-data state. To put it more concretely, a written-data state can be defined as a set state whereas an erased-data state can be defined as a reset state. As an alternative, a written-data state is conversely defined as a reset state whereas an erased-data state is conversely defined as a set state.

In the following description, the written-data state is defined as a set state which is established by decreasing the insulating characteristic of the insulation film 102 so as to reduce the resistance of the entire variable-resistance cell resistor Rcell to a sufficiently small value whereas, conversely, the erased-data state is defined as a reset state which is established by restoring the insulating characteristic of the insulation film 102 to its original level prevailing in the initial state so as to increase the resistance of the entire variable-resistance cell resistor Rcell to a sufficiently large value.

For the reason described above, the insulation film 102 can be said to be a typical implementation of a variable-resistance layer.

The directions of the arrows each indicating the direction of a current flowing through the variable-resistance cell resistor Rcell as shown in the circuit diagrams of FIGS. 1A and 1B agree with the directions of the arrows each indicating the direction of a current flowing through the variable-resistance cell resistor Rcell as shown in the cross-sectional diagrams of FIGS. 3A and 3B. To put it more concretely, in the data set (or data write) operation carried out to establish the written-data state defined as the set state, the write current Iw is flowing from the plate line PL to the bit line BL. In the data reset (or data erase) operation carried out to establish the erased-data state defined as the reset state, the erase current Ie is flowing from the bit line BL to the plate line PL.

Figure 4:
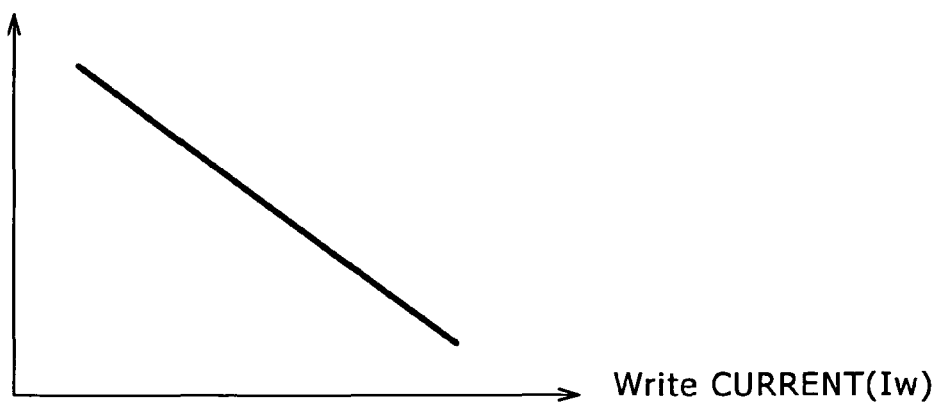
FIG. 4 is a diagram showing a graph representing dependence of the cell resistance of the variable-resistance storage element on a write current flowing through the variable-resistance storage element.

As shown in a diagram of FIG. 4, the resistance of the entire variable-resistance cell resistor Rcell changes with the magnitude of the write current Iw. In the following description, the resistance of the entire variable-resistance cell resistor Rcell is also referred to simply as a cell resistance Rc. Since the cell resistance Rc changes with the magnitude of the write current Iw linearly to a certain degree, by controlling the write current Iw, the variable-resistance cell resistor Rcell can be used for storing a number of different values. For example, the variable-resistance cell resistor Rcell can be used for storing three or more different values.

By changing the resistance of the variable-resistance cell resistor Rcell from a small value to a large value or vice versa in a reversible manner, it is possible to establish the aforementioned set and reset states which can be associated with two stored values respectively. That is to say, the variable-resistance cell resistor Rcell can be used as a 2-value variable-resistance storage element. In addition, the set and reset states of exhibiting respectively the large and small cell resistances Rc representing respectively two different values of data stored in the memory cell MC are sustained even if a voltage applied to the variable-resistance cell resistor Rcell is removed. Thus, the memory cell MC functions as a nonvolatile memory.

It is to be noted that, in an actual data set operation, the resistance of the insulation film 102 of the variable-resistance cell resistor Rcell changes in accordance with the number of metallic ions injected into the insulation film 102. Thus, the insulation film 102 can be regarded as an actual storage layer used for storing data.

A memory cell MC is constructed by making use of a variable-resistance cell resistor Rcell, and a number of such memory cells MC are laid out to form a memory-cell matrix which is used as a core portion of a memory device. In addition to the memory-cell matrix, the memory device includes driving circuits which are each referred to as a peripheral circuit.

In general, a data update (that is, write or erase) operation is carried out by consecutively performing a plurality of successive compound operations each including a data transition sub-operation, a direct verify sub-operation performed after the data transition sub-operation and inhibit control executed after the direct verify sub-operation.

By the way, if the data transition sub-operation is carried out as a part of the data write (or erase) operation a number of times repeatedly on the variable-resistance cell resistor Rcell having the configuration shown in the diagrams of FIGS. 1A to 3B, the cell resistance Rc of the variable-resistance cell resistor Rcell in the set state of exhibiting a small resistance as a result of the data write operation may be set at a value smaller than a level presumed in advance in some cases, or the cell resistance Rc of the variable-resistance cell resistor Rcell in the reset state of exhibiting a large resistance as a result of the data erase operation may be set at a value higher than a level presumed in advance in some cases.

However, the embodiment is provided in order to cope with the problem of an unintended change caused by a data update (write or erase) operation to write data into the memory cell MC or erase data from the memory cell MC as a change in cell resistance Rc. To put it in detail, inhibit control is executed as a part of the data update operation in order to determine whether or not a data transition sub-operation and a direct verify sub-operation need to be repeated as a part of the data update operation in accordance with a determination result produced by the direct verify sub-operation also carried out as a part of the data update operation prior to the inhibit control. In the data update operation including the inhibit control, it is important to reduce a cycle time period from the data transition sub-operation to the direct verify sub-operation and to carry out a process of reflecting the determination result produced by the direct verify sub-operation in the inhibit control at a high speed with a high degree of reliability.

Direct Verify Sub-Operation

In the embodiment of the present invention, the sense amplifier SA adopts a method in accordance with which residual electric charge remaining on the bit line BL after application of an update pulse (that is, a write pulse or an erase pulse) is discharged through the memory cell during a fixed period of time and a voltage change obtained as a result of the electrical discharge process is detected. In accordance with this method, a special process of electrically pre-charging the bit line BL for a verify sub-operation is not required. Thus, the verify sub-operation according to the present invention is referred to as a direct verify sub-operation.

In the direct verify sub-operation, the sense amplifier SA may also adopt a method in accordance with which electric charge on the plate line PL is transferred to the bit line BL after application of an update pulse (that is, a write pulse or an erase pulse) for initiating the data transition sub-operation through the memory cell during a fixed period of time, and a voltage change resulting from the electrical transfer process as a voltage change occurring on the bit line BL is detected by the sense amplifier SA in the verify sub-operation. In addition, instead of driving the sense amplifier SA to carry out an operation to sense a voltage, an operation to sense a current can also be performed.

The following description explains a typical configuration in which electric charge on the plate line PL is transferred to the bit line BL having an electric potential lower than an electric potential appearing on the data transition sub-operation through the memory cell during a fixed period of time, and a voltage change occurring on the bit line BL is detected by the sense amplifier SA in an operation to sense a voltage.

The memory device according to the embodiment employs a driving control section configured to control the direct verify sub-operation in addition to the data update operation itself. In addition, the memory device also includes the sense amplifier SA cited above and an inhibit control section configured to inhibit an additional operation (or update) pulse from being applied to serve as a pulse for generating a cell current flowing in a specific direction in accordance with a voltage sensing result produced by the sense amplifier SA which is denoted by reference numeral 7 in a block diagram of FIG. 5 to be described later.

It is desirable to provide the driving control section with a write buffer configured to apply a voltage to be set next on the bit line BL serving as the first wire properly for a case in which the additional operation pulse is required and a case in which the additional operation pulse is not required in accordance with a voltage sensing result produced by the sense amplifier SA. It is to be noted that a data erase operation can be interpreted as an operation to provide the memory cell MC with data having logic obtained as a result of inverting the logic of data which is stored in the memory cell MC in the data write operation. Thus, the write driver is a driving circuit configured to control executions of both the data write operation and the data erase operation. In order to avoid misunderstanding, however, such a driving circuit is referred to as a set/reset driver 75 for controlling executions of both the data write (or set) operation and the data erase (or reset) operation.

The following description explains a typical column-circuit configuration which is a basic unit for carrying out the operation of a peripheral circuit having the set/reset driver 75 embedded in the sense amplifier SA to serve as a driver with the function described above.

IC-Chip Configuration

Figure 5:
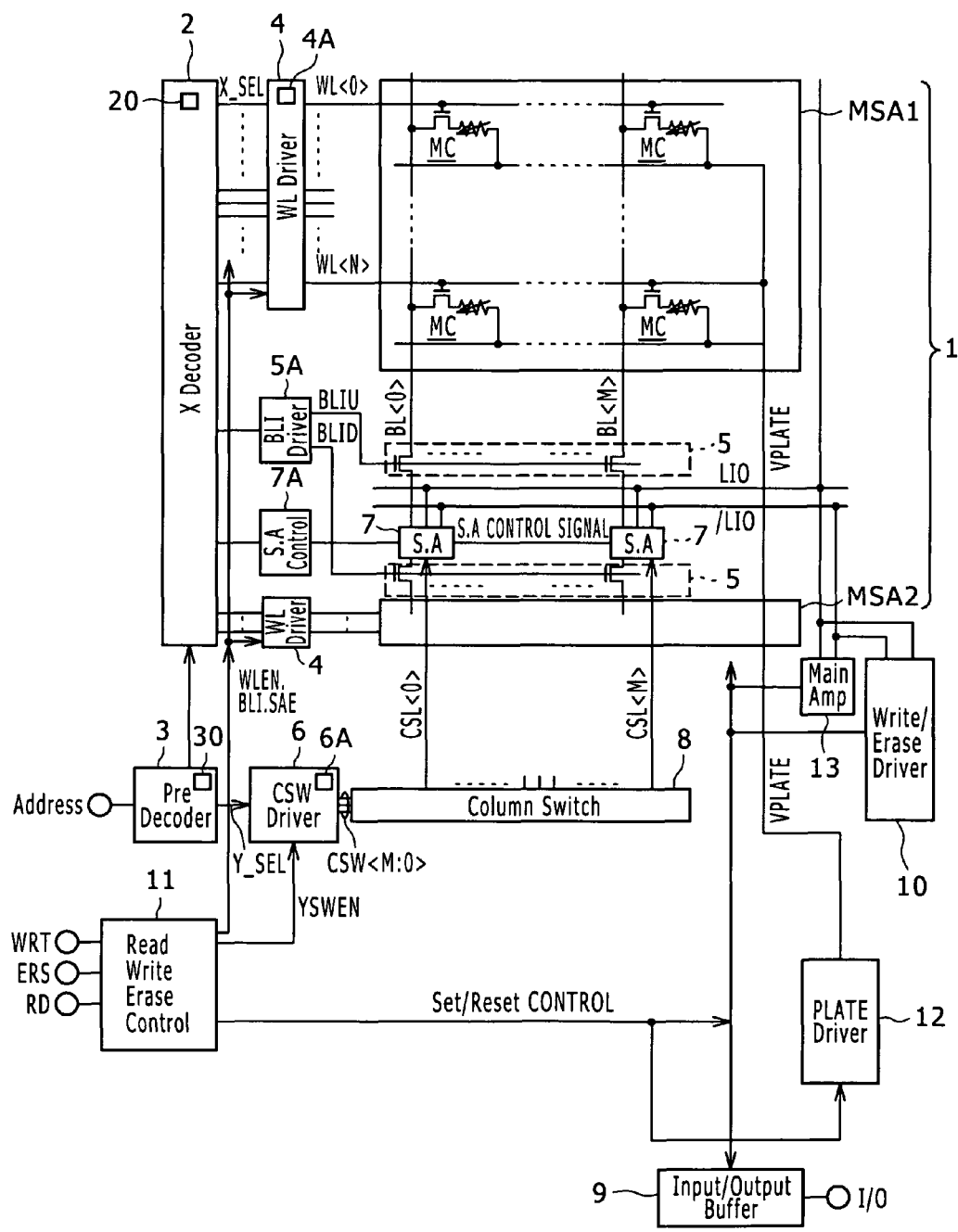
FIG. 5 is a block diagram showing the configuration of an IC chip of the memory device according to the first and second embodiments.

FIG. 5 is a block diagram showing the configuration of an IC chip of the memory device.

The memory device shown in the block diagram of FIG. 5 employs a memory array 1 and peripheral circuits of the memory array 1. The memory array 1 includes memory sub-arrays MSA1 and MSA2 which are each formed as a matrix of memory cells MC shown in the diagrams of FIGS. 1A to 3B. In the following description, a memory sub-array is also referred to as a MAT. Each of the memory sub-arrays MSA1 and MSA2 has rows and columns. Each of the rows has (M+1) memory cells MC laid out in the row direction whereas each of the columns has (N+1) memory cells MC laid out in the column direction. Each of reference symbols M and N denotes a relatively large integer. The concrete value of M and N can be set arbitrarily.

As shown in the block diagram of FIG. 5, the memory array 1 includes the two memory sub-arrays MSA1 and MSA2. However, the number of memory sub-arrays MSA is any of arbitrary numbers such as 8, 16 and so on.

As described above, each of the rows of a memory sub-array MSA has (M+1) memory cells MC laid out in the row direction. The gates of the access transistors AT each employed in one of the (M+1) memory cells MC are connected to the same word line WL oriented in the row direction. Thus, there are as many word lines WL as the rows. The number of word lines WL or the number of rows is (N+1). In the block diagram of FIG. 5, the (N+1) word lines WL are denoted by reference notations WL<0> to WL<N> respectively. The word lines WL<0> to WL<N> each oriented in the row direction are laid out in the column direction at intervals determined in advance. On the other hand, each of the columns of a memory sub-array MSA has (N+1) memory cells MC laid out in the column direction as described above. The drains of the access transistors AT each employed in one of the (N+1) memory cells MC are connected to the same bit line BL oriented in the column direction. Thus, there are as many bit lines BL as the columns. The number of bit lines BL or the number of columns is (M+1). In the block diagram of FIG. 5, the (M+1) bit lines BL are denoted by reference notations BL<0> to BL<M> respectively. The bit lines BL<0> to BL<M> each oriented in the column direction are laid out in the row direction at intervals determined in advance.

As described above, a specific end of the variable-resistance resistor Rcell is connected to a plate line PL whereas the other end of the variable-resistance resistor Rcell is connected to the source of the access transistor AT. The specific ends of the variable-resistance resistors Rcell on any particular one of the rows are connected to a common horizontal plate line PL associated with the particular row. Thus, each of the memory sub-arrays MSA1 and MSA2 has as many horizontal plate lines PL as the rows. That is to say, each of the memory sub-arrays MSA1 and MSA2 has (N+1) horizontal plate lines PL. The (N+1) horizontal plate lines PL each oriented in the row direction are laid out in the column direction at intervals determined in advance. Specific ends of the horizontal (N+1) plate lines PL are connected to each other by a wire VPLATE which is linked to a plate driver 12 provided at a location outside the memory array 1.

In addition, as an alternative, it is also possible to provide a configuration in which the specific ends of the variable-resistance resistors Rcell on any particular one of the columns are connected a common vertical plate line PL associated with the particular column. In this alternative configuration, each of the memory sub-arrays MSA1 and MSA2 has as many plate vertical lines PL as the columns. That is to say, each of the memory sub-arrays MSA1 and MSA2 has (M+1) vertical plate lines PL. The vertical (M+1) plate lines PL each oriented as a long wire in the column direction are laid out in the row direction at intervals determined in advance. Specific ends of the (M+1) vertical plate lines PL are connected to each other by a wire which is linked to the plate driver 12 provided at a location outside the memory array 1.

As shown in the block diagram of FIG. 5, the peripheral circuits include an X-address decoder 2, a pre-decoder 3 also functioning as a Y-address decoder, a WL driver 4, a BLI (bit-line isolation) driver 5A and a CSW (column switch) driver 6. In addition, the peripheral circuits also employ an SA (sense amplifier) 7 provided for each of the columns, a column switch 8 and an I/O (input/output) buffer 9. On top of that, the peripheral circuits also have a write/erase driver 10, a control circuit 11, the plate driver 12 cited above and a main amplifier 13.

The X-address decoder 2 is configured to include a plurality of X selectors 20 which each serve as the basic unit of the X-address decoder 2. The X-address decoder 2 is a circuit configured to decode an X-address signal received from the pre-decoder 3 and to supply an X select signal X_SEL selected on the basis of a result of the decoding process to the WL driver 4. The X selector 20 will be described later in detail.

The pre-decoder 3 is a circuit configured to split an input address signal into an X address signal and a Y address signal. The pre-decoder 3 supplies the X address signal to the X-address decoder 2. On the other hand, a Y-address decode section employed in the pre-decoder 3 decodes the Y address signal.

The Y-address decode section employed in the pre-decoder 3 is configured to include a plurality of Y selectors 30 which each serve as the basic unit of the Y-address decode section. The Y-address decode section employed in the pre-decoder 3 is a circuit configured to decode a Y-address signal obtained as a result of splitting the input address signal and to supply a Y select signal Y_SEL selected on the basis of a result of the decoding process to the CSW driver 6. The Y selector 30 will be described later in detail.

The WL driver 4 is configured to include a plurality of (N+1) WL-driver units 4A which are each provided for a word line WL. To put it detail, the output terminal of each of the (N+1) WL-driver units 4A is connected to one of the (N+1) word lines WL<0> to WL<N>. The X select signal X_SEL received from the X-address decoder 2 is used for selecting one of the (N+1) WL-driver units 4A. The selected one of the (N+1) WL-driver units 4A applies a voltage determined in advance to a word line WL that is connected to the output terminal of the selected WL-driver unit 4A. The WL-driver unit 4A will be described later in detail.

The CSW driver 6 is configured to include a plurality of CSW-driver units 6A which each serve as the basic unit of the CSW driver 6. The CSW driver 6 is a circuit configured to generate a column switch signal CSW<M:0> and, if necessary, a signal obtained by inverting the column switch signal CSW<M:0>, in accordance with the Y select signal Y_SEL received from the pre-decoder 3. The column switch signal CSW<M:0> generated by the CSW driver 6 is a signal supplied by the CSW driver 6 to the column switch 8 to serve as a signal for controlling the column switch 8. The CSW-driver unit 6A will be described later in detail.

The column switch 8 is a group of switches each configured to include only an NMOS transistor. As an alternative, the column switch 8 can also be a group of TGs (transmission gates) created from an NMOS transistor and a PMOS transistor by connecting the sources of the NMOS transistor and the PMOS transistor to each other and by connecting the drains of the NMOS transistor and the PMOS transistor to each other. Each of the switches included in the column switch 8 is connected to one of the bit lines BL through a corresponding one of the sense amplifiers 7. That is to say, the column switch 8 employs a total of (M+1) switches.

The column switch 8 is capable of controlling an operation to select and deselect one of circuits which all have one of various types. In the case of the memory device shown in the block diagram of FIG. 5, the column switch 8 outputs one of column select lines CSL<0> to CSL<M> in order to select one the sense amplifiers 7. As shown in the block diagram of FIG. 5, each of the sense amplifiers 7 inputs and outputs data between a bit line BL connected to the sense amplifier 7 and a pair of a local input/output line LIO and a partner local input/output line /LIO.

The pair of a local input/output line LIO and a partner local input/output line /LIO are connected to not only the sense amplifiers 7, but also the write/erase driver 10 and the main amplifier 13.

The main amplifier 13 is a circuit configured to amplify output data read out by a selected sense amplifier 7 from a memory cell MC and to supply the amplified output data to an external I/O bus by way of the I/O buffer 9.

The write/erase driver 10 is connected to the I/O buffer 9 which supplies input data coming from the external I/O bus to the write/erase driver 10. The write/erase driver 10 passes on the input data to the memory cell MC by way of the pair of a local input/output line LIO and a partner local input/output line /LIO and the selected sense amplifier 7. The input data coming from the external I/O bus is finally stored in the memory cell MC.

The control circuit 11 operates on the basis of a data write signal WRT, a data erase signal ERS and a data read signal RD which are supplied to the control circuit 11.

The control circuit 11 has the following five functions.
(1): A function to execute control of the sense amplifier 7 by supplying an activation signal to a sense-amplifier control section 7A by way of the X-address decoder 2.
(2): A function to execute control of a BLI switch 5 by supplying an activation signal to a BLI driver 5A by way of the X-address decoder 2.
(3): A function to execute write control for controlling the plate driver 12 and the write/erase driver 10 in a data write operation:
(4): A function to execute word-line control for controlling the WL driver 4 in a data write operation and a data read operation.
(5): A function to execute column-switch control for controlling the column switch 8 by supplying a control signal to the column switch 8 by way, of the CSW driver 6 in a data write operation and a data read operation.

Each of the various control signals output by the control circuit 11 is merely denoted by a reference symbol in the block diagram of FIG. 5. However, each of the various control signals will be described later in detail.

The block diagram of FIG. 5 does not show other circuits such as a circuit for generating a variety of voltages from a power-supply voltage and a circuit for controlling generation of a clock signal.

Control-System Circuits

Next, the following description explains the X selector 20 serving as the basic unit of the X-address decoder 2 and the Y selector 30 serving as the basic unit of the Y-address decode section employed in the pre-decoder 3. Then, the following description explains the WL-driver unit 4A serving as the basic unit of the WL driver 4 and the CSW-driver unit 6A serving as the basic unit of the CSW driver 6.

Figure 6:
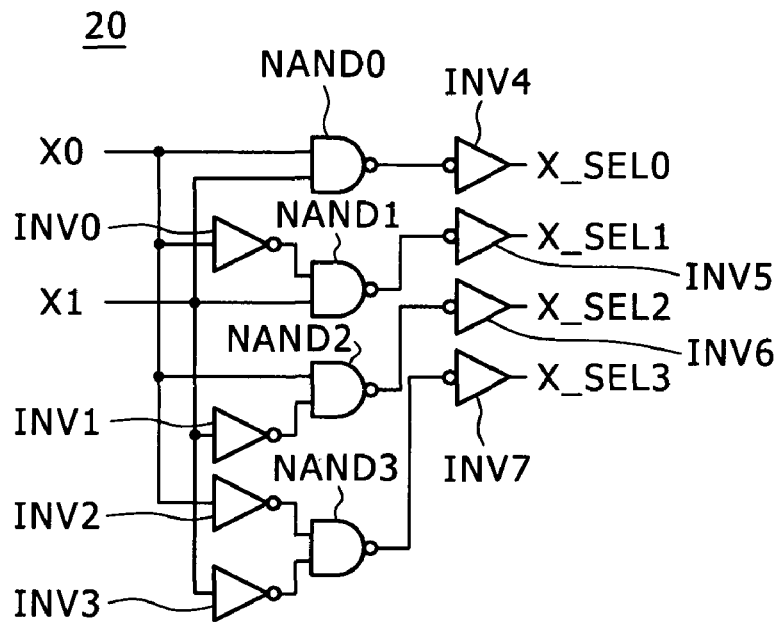
FIG. 6 is a circuit diagram showing a typical circuit of an X selector employed in the memory device.

FIG. 6 is a circuit diagram showing a typical circuit of the X selector 20.

The X selector 20 shown in the circuit diagram of FIG. 6 is configured to employ four inverters INV0 to INV3 provided at the front stage, four NAND circuits NAND0 to NAND3 provided at the middle stage and four other inverters INV4 to INV7 provided at the rear stage.

The X selector 20 receives X-address bits X0 and X1, activating one of four X select signals XSEL0 to X_SEL3 in accordance with a result of decoding the X-address bits X0 and X1. Typically, the X selector 20 activates any particular one of the four X select signals XSEL0 to X_SEL3 by setting the particular X select signal X_SEL at a high level.

The X selector 20 shown in the circuit diagram of FIG. 6 is a typical 2-bit decoder. In accordance with the number of input X-address bits X to be decoded, however, the configuration of the X-address decoder 2 can be expanded or the number of stages composing the configuration can be increased so as to keep up with three or more input X-address bits X.

Figure 7:
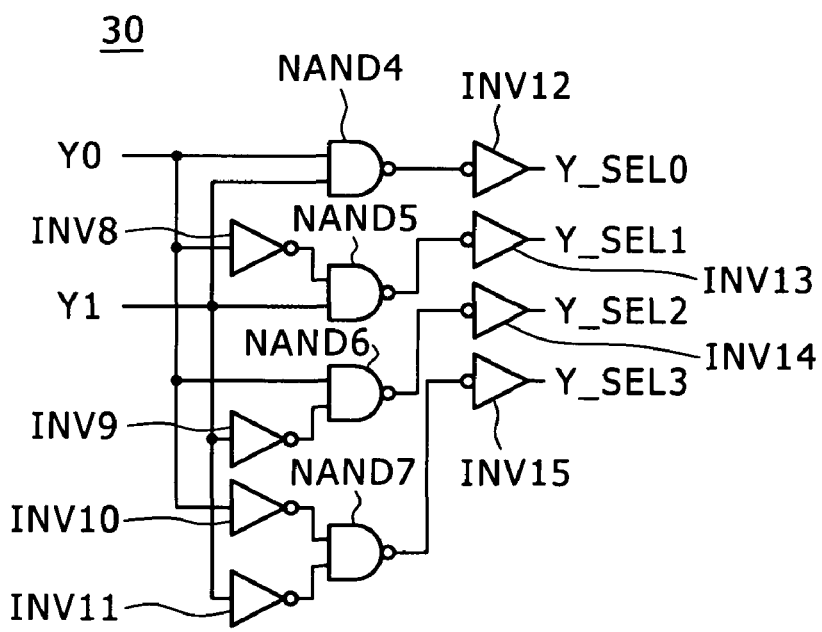
FIG. 7 is a circuit diagram showing a typical circuit of a Y selector employed in the memory device.

FIG. 7 is a circuit diagram showing a typical circuit of the Y selector 30.

The Y selector 30 shown in the circuit diagram of FIG. 7 is configured to employ four inverters INV8 to INV11 provided at the front stage, four NAND circuits NAND4 to NAND7 provided at the middle stage and four other inverters INV12 to INV15 provided at the rear stage.

The Y selector 30 receives Y-address bits Y0 and Y1, activating one of four Y select signals Y_SEL0 to Y_SEL3 in accordance with a result of decoding the Y-address bits Y0 and Y1. Typically, the Y selector 30 activates any particular one of the four Y select signals Y_SEL0 to Y_SEL3 by setting the particular Y select signal Y_SEL at a high level.

The Y selector 30 shown in the circuit diagram of FIG. 7 is a typical 2-bit decoder. In accordance with the number of input Y-address bits Y to be decoded, however, the configuration of the pre-decoder 3 can be expanded or the number of stages composing the configuration can be increased so as to keep up with three or more input Y-address bits Y.

Figure 8:
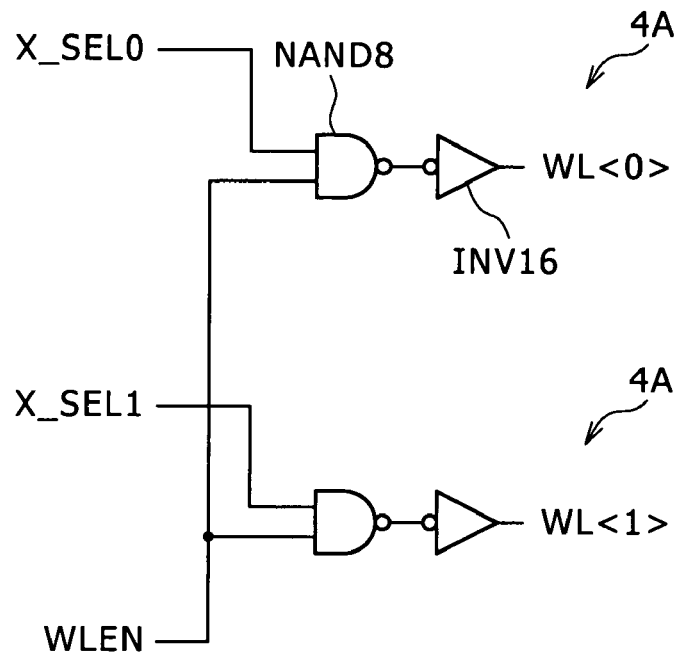
FIG. 8 is a circuit diagram showing two adjacent units of a WL driver employed in the memory device.

FIG. 8 is a circuit diagram showing two adjacent WL-driver units 4A of the WL driver 4.

The WL driver 4 employs as many WL-driver units 4A each shown in the circuit diagram of FIG. 8 as the rows of the memory-cell matrix or as memory cells MC provided on every column of the memory-cell matrix. As is obvious from the description given earlier, the number of rows composing the memory-cell matrix or the number of memory cells MC provided on every column of the memory-cell matrix is (N+1). In order to better understand the explanation, the reader is suggested to refer back to the block diagram of FIG. 5.

Each of the (N+1) WL-driver units 4A is driven to operate by an X select signal X_SEL selected (or activated) by the X selector 20 shown in the circuit diagram of FIG. 6. In the case of the configuration shown in the circuit diagram of FIG. 8, the two WL-driver units 4A are driven to operate by the X select signals X_SEL0 and X_SEL1 respectively. The WL-driver unit 4A driven by the X select signal X_SEL0 or X_SEL1 activates the word line WL<0> or WL<1> respectively.

As shown in the circuit diagram of FIG. 8, each WL-driver unit 4A is configured to employ a NAND circuit and an inverter. In the case of the configuration shown in the circuit diagram of FIG. 8, the upper WL-driver unit 4A is configured to employ a NAND circuit NAND8 and an inverter INV16.

One of the input terminals of the NAND circuit NAND8 receives a WL select enable signal WLEN whereas the other input terminal of the NAND circuit NAND8 receives the X select signal X_SEL0 or X_SEL1. The output terminal of the NAND circuit NAND8 is connected to the input terminal of the inverter INV16. The output terminal of the inverter INV16 is connected to a word line WL<0> or WL<1>. A signal output by the inverter INV16 puts the word line WL connected to the inverter INV16 in an active or inactive state.

Figure 9:
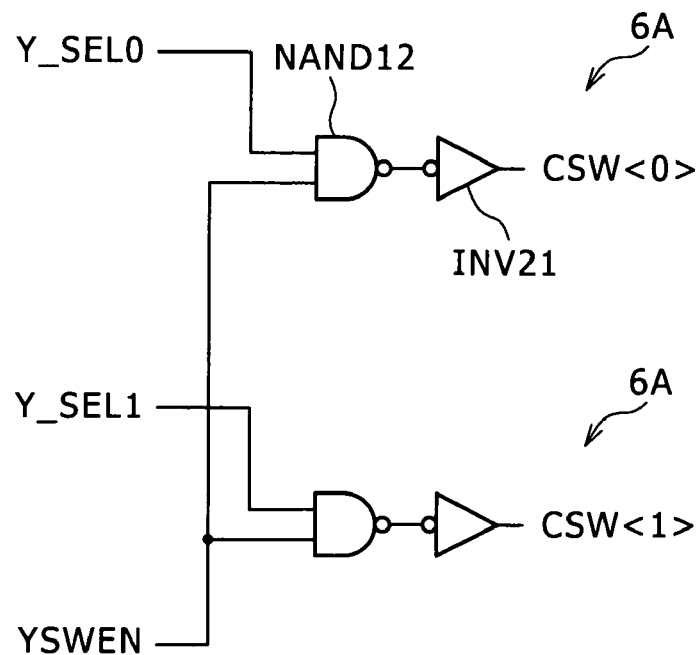
FIG. 9 is a circuit diagram showing two adjacent units of a CSW driver employed in the memory device.

FIG. 9 is a circuit diagram showing two adjacent CSW-driver units 6A of the CSW driver 6.

As shown in the circuit diagram of FIG. 9, each CSW-driver unit 6A is configured to employ a NAND circuit and an inverter. In the case of the configuration shown in the circuit diagram of FIG. 9, the upper CSW-driver unit 6A is configured to employ a NAND circuit NAND12 and an inverter INV21. The output terminal of the NAND circuit NAND12 is connected to input terminal of the inverter INV21.

One of the input terminals of the NAND circuit NAND 12 receives a Y switch enable signal YSWEN whereas the other input terminal of the NAND circuit NAND 12 receives the Y select signal Y_SEL0 or X_SEL1 selected (or activated) by the Y selector 30 shown in the circuit diagram of FIG. 7. If both the Y switch enable signal YSWEN and the Y select signal Y_SEL are set at a high level representing an active state, the signal output by the NAND circuit NAND 12 is put at the low level. Thus, the column select line CSW<0> or CSW<1> is set at the high level representing an active state in the case of this embodiment.

The column select lines CSW<0>, CSW<1> and so on are denoted by reference symbol CSW<M:0> in the block diagram of FIG. 5 and supplied to the column switch 8.

The control circuit 11 shown in the block diagram of FIG. 5 generates the WL select enable signal WLEN shown in the circuit diagram of FIG. 8 and the Y-switch enable signal YSWEN shown in the circuit diagram of FIG. 9, supplying the WL select enable signal WLEN and the Y-switch enable signal YSWEN to the WL driver 4 and the CSW driver 6 respectively.

The control circuit 11 operates on the basis of the data write signal WRT, the data erase signal ERS and the data read signal RD, which are supplied to the control circuit 11, generating a variety of control signals in addition to the WL select enable signal WLEN and the Y-switch enable signal YSWEN. The control signals other than the WL select enable signal WLEN and the Y-switch enable signal YSWEN include a BLI (Bit Line Isolation) signal for controlling the BLI driver 5A, an SAE (Sense amplifier Enable) signal for controlling the sense-amplifier control section 7A and inverted signals thereof. In order to better understand the explanation, the reader is suggested to refer to the block diagram of FIG. 5.

Column-Circuit Configuration

Figure 10:
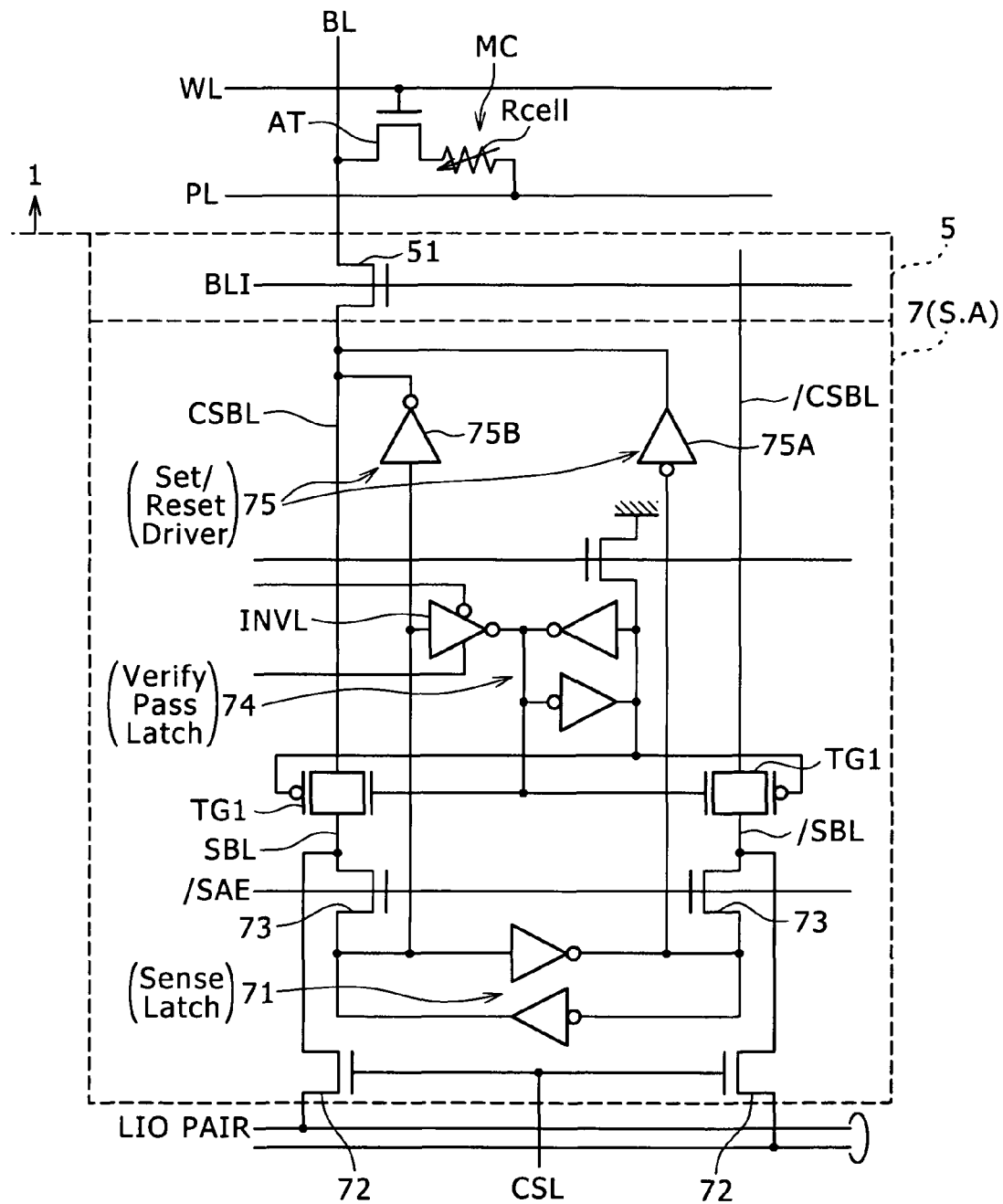
FIG. 10 is a conceptual diagram showing the configuration of a column circuit employed in the memory device according to the first embodiment.

FIG. 10 is an outline circuit diagram showing the configuration of a column circuit provided for the memory device according to the first embodiment.

As is obvious from the circuit diagram of FIG. 10, the memory device employs the memory array 1 and the driving circuits of the memory array 1. The memory array 1 includes memory cells MC which are laid out to form a matrix. The memory cell MC is a memory cell shown in diagrams such as the circuit diagram of FIGS. 1A and 1B. In the following description, the driving circuits are also referred to as peripheral circuits. Much like the memory device shown in the block diagram of FIG. 5, the memory array 1 can be configured to include an upper memory sub-array MSA1 and a lower memory sub-array MSA2 which are each formed as a sub-matrix of memory cells MC. In this case, the upper memory sub-array MSA1 and the lower memory sub-array MSA2 share sense amplifiers SA included in the peripheral circuit to serve as amplifiers common to the upper memory sub-array MSA1 and a lower memory sub-array MSA2. However, this configuration including sense amplifiers SA shared by the upper memory sub-array MSA1 and the lower memory sub-array MSA2 is not absolutely required. Instead, it is possible to construct an alternative typical configuration in which the upper memory sub-array MSA1 is provided with a peripheral circuit section including sense amplifiers SA different from sense amplifiers SA included in a peripheral circuit provided for the lower memory sub-array MSA2.

The technical term 'column-circuit configuration' used in the specification of the present invention is defined as a configuration including bit lines BL connected to memory cells MC, from which data is to be read out, and peripheral circuits relevant to the direct verify sub-operation described earlier.

FIG. 10 is a circuit diagram showing a typical column-circuit configuration. As is obvious from the above definition, however, configuration sections each denoted by a reference notation do not have to be located in an area having a shape resembling a column. As long as the memory cells MC are connected to the configuration sections and the configuration sections are connected to each other to form a configuration like the one shown in the circuit diagram of FIG. 10, the configuration formed by the memory cells MC and the configuration sections as shown in the circuit diagram of FIG. 10 can said to be a column-circuit section.

If the configuration sections are to be provided at locations in close proximity to the sense amplifiers 7, on the other hand, it is desirable to position the configuration sections at such locations that the entire configuration can be accommodated in an area having a shape resembling a column.

It is to be noted that the technical term 'driving control section' used in the specification of the present invention can be interpreted to imply sections of the column-circuit configuration excluding the memory array 1, the sense amplifiers 7, a sense-amplifier control section 7A and an inhibit control section which is not shown in the circuit diagram of FIG. 10. However, another definition of the 'driving control section' can be adopted.

Figure 11:
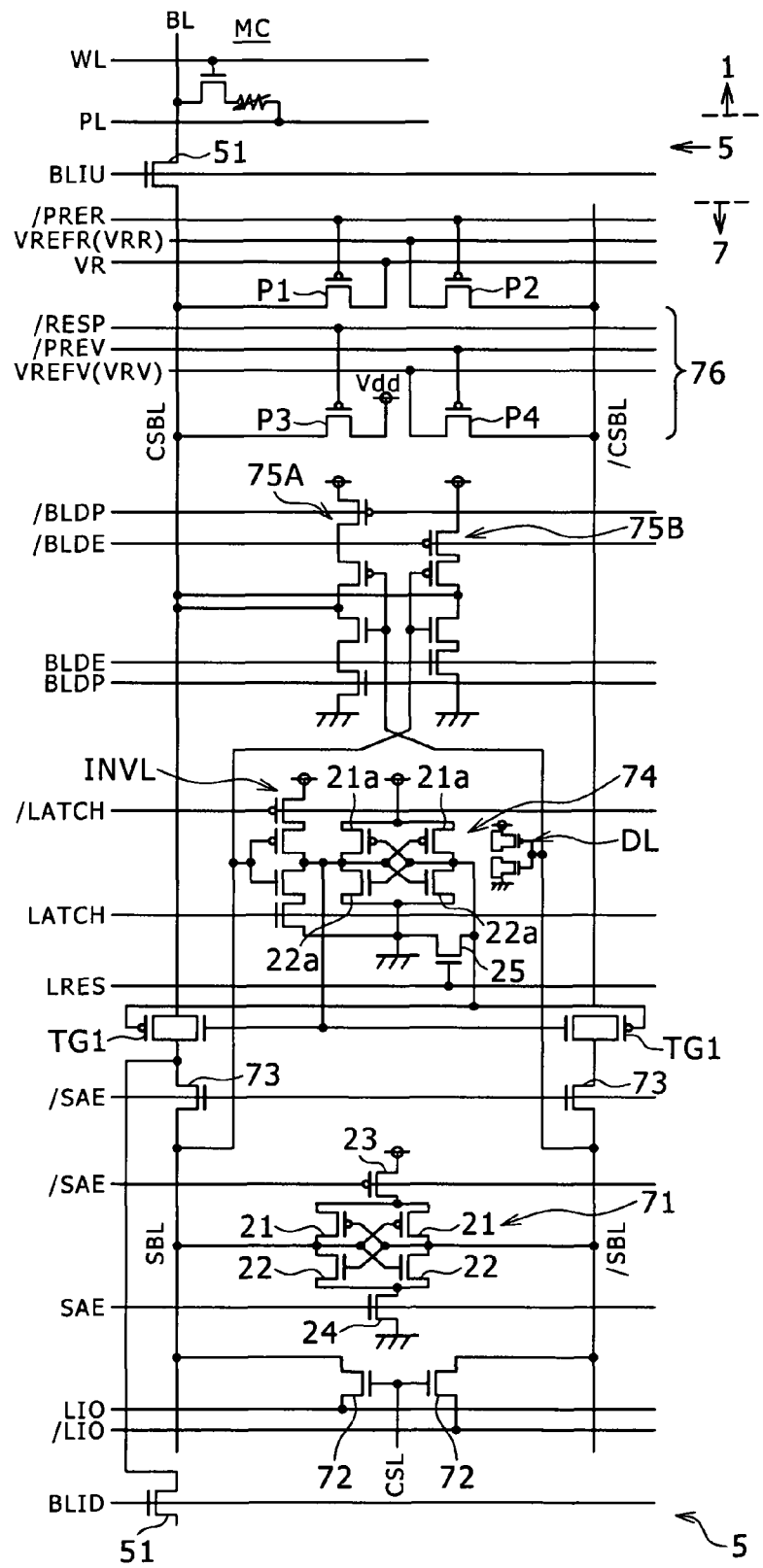
FIG. 11 is a circuit diagram showing the configuration of the column circuit employed in the memory device according to the first embodiment.
Figure 12:
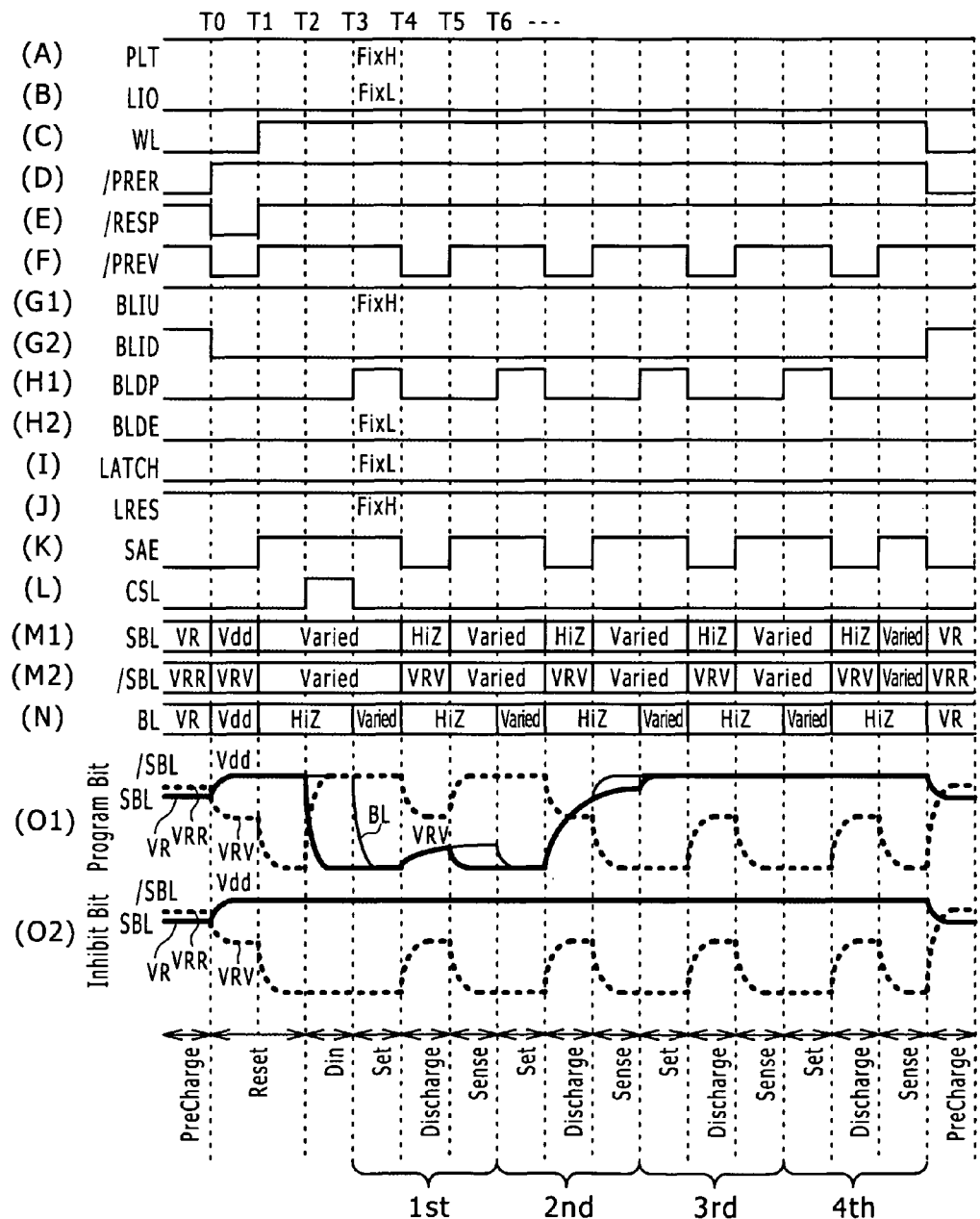
Figure 13:
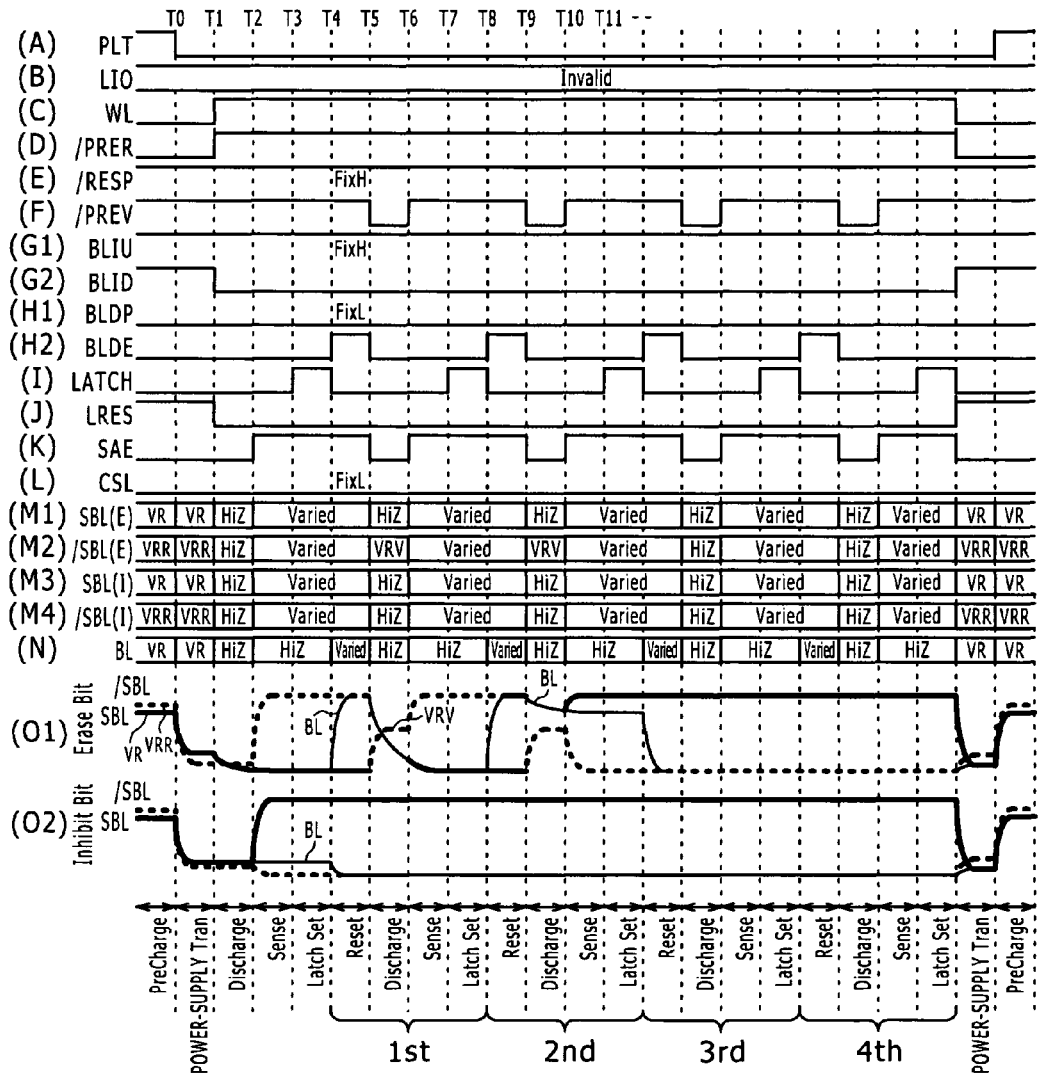
Figure 14:
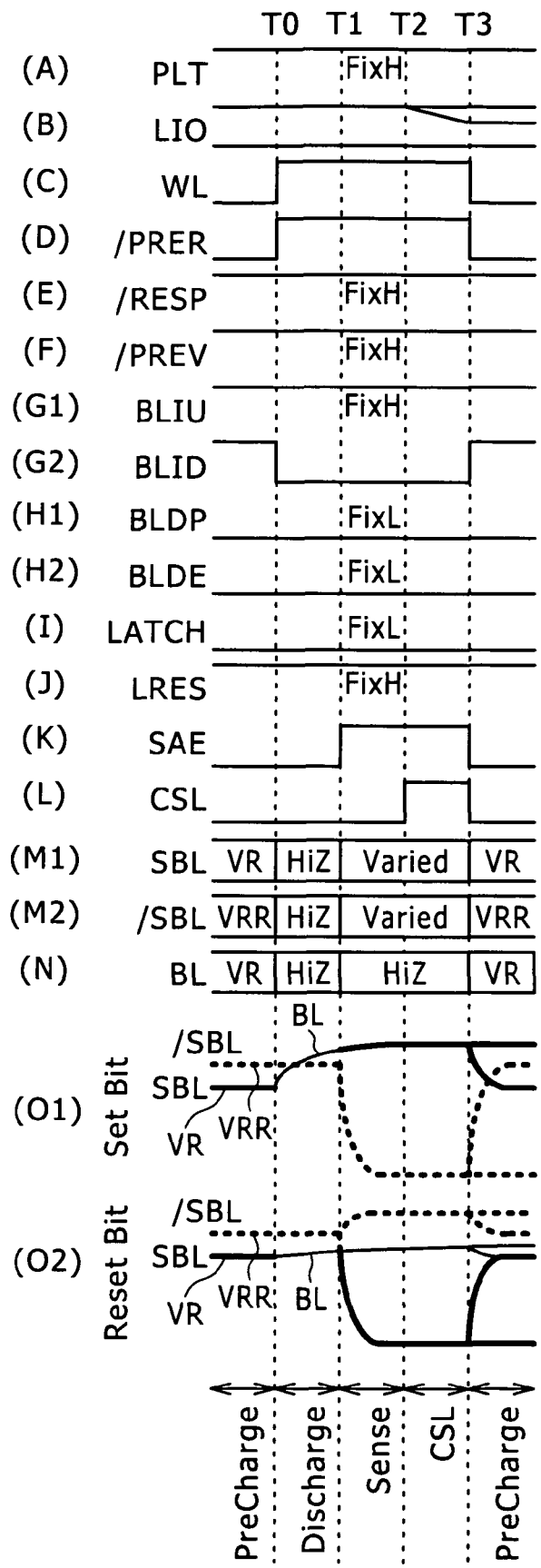

For example, the driving control section may include a circuit for generating voltages/signals used for controlling a column circuit shown in a diagram of FIG. 11. However, the technical term 'driving control section' used in the specification of the present invention to imply a driving control section provided for every plurality of columns is interpreted as sections of the column-circuit configuration excluding the memory array 1, the sense amplifiers 7, the sense-amplifier control section 7A and an inhibit control section which is not shown in the circuit diagram of FIG. 11.

The column-circuit configuration according to the first embodiment has flip-flop-type sense amplifiers (SAs) 7 each used for sensing an electric potential which is appearing on a bit line BL. The sense amplifier 7 is connected to a pair of a common sense bit line CSBL and a partner common sense bit line /CSBL as well as a pair of a local input/output line LIO and a partner local input/output line /LIO.

The basic configuration of the sense amplifier 7 includes a flip-flop sense latch circuit 71 configured to sense the magnitude of an electric potential appearing between the pair of a common sense bit line CSBL and a partner common sense bit line /CSBL and to amplify the electric potential. The sense amplifier 7 also has two NMOS transistors both denoted by reference numeral 72 and used for controlling the connection between the flip-flop sense latch circuit 71 and the pair of a local input/output line LIO and a partner local input/output line /LIO. In the following description, the pair of a common sense bit line CSBL and a partner common sense bit line /CSBL is also referred to simply as a CSBL pair whereas the pair of a local input/output line LIO and a partner local input/output line /LIO is also referred to simply as an LIO pair.

The flip-flop sense latch circuit 71 corresponds to the sense amplifier of the present invention. As shown in the circuit diagram of FIG. 10, the sense amplifier of the embodiment may include two NMOS transistors both denoted by reference symbol 73 and controlled by an inverted SA enable signal /SAE, which is an active low signal. The two NMOS transistors 73 will also be described later.

Each of the two NMOS transistors 72 is controlled to enter a turned-on or turned-off state by an electric potential asserted on a column select line CSL by the column switch 8 shown in the block diagram of FIG. 5.

The two NMOS transistors 72 are used in implementation of a data read operation to transfer sensed and latched data from the memory cell MC to the pair of a local input/output line LIO and a partner local input/output line /LIO. In addition, the two NMOS transistors 72 are also used in implementation of a data update operation to forcibly transfer sensed and latched data from the pair of a local input/output line LIO and a partner local input/output line /LIO to the memory cell MC by way of a write driver.

The sense amplifier 7 shown in the circuit diagram of FIG. 10 is configured to include set/reset drivers 75 controlled in accordance with sensed and latched data as well as a verify latch circuit 74. The verify latch circuit 74 corresponds to a latch circuit included in an inhibit control section of the present invention to serve as a circuit for holding a binary value indicating that a transition of the data storage state has been sufficient or insufficient.

One of data holding nodes of the set/reset driver 75 is connected to an inverter INVL for inverting data held by one of data holding nodes of the flip-flop sense latch circuit 71 and loading the inverted data into two transmission gate circuits TG1. A pair of data holding nodes of the verify latch circuit 74 are connected to the control gates of the two transmission gate circuits TG1 which are provided between a pair of a sense bit line SBL and a partner sense bit line /SBL and a pair of a common sense bit line CSBL and a partner common sense bit line /CSBL.

The inverter INVL corresponds to a latch-input control section of the present invention.

The transmission gate circuits TG1 inhibit an operation to sense a voltage from being carried out in response to held-data inversion carried out by the verify latch circuit 74. In this way, the transmission gate circuits TG1 perform an important role as a switch for blocking a change of a voltage appearing between the pair of a common sense bit line CSBL and a partner common sense bit line /CSBL. Thus, the transmission gate circuits TG1 correspond to a switch provided by the present invention as a switch controlled in accordance with a binary value held in the verify latch circuit. The transmission gate circuits TG1 used as such a switch control an operation to the connect bit line BL serving as the first wire to the sense bit line SBL and an operation to electrically disconnect the connect bit line BL serving as the first wire from the sense bit line SBL which is linked to a sense node of the flip-flop sense latch circuit 71. Thus, the first wire according to the concept of the embodiment of the present invention actually includes both the common sense bit line CSBL and the bit line BL.

The verify latch circuit 74 is a latch circuit configured to hold pass or fail information generated in a direct verify sub-operation.

An NMOS transistor 73 is connected between a specific one of the transmission gate circuits TG1 and the first data holding node of the flip-flop sense latch circuit 71. By the same token, another NMOS transistor 73 is connected between the other one of the transmission gate circuits TG1 and the second data holding node of the flip-flop sense latch circuit 71.

The NMOS transistors 73 are used for detaching the sense amplifier 7 from the pair of a sense bit line SBL and a partner sense bit line /SBL as well as the pair of a common sense bit line CSBL and a partner common sense bit line /CSBL. With the sense amplifier 7 electrically disconnected from the pair of a sense bit line SBL and a partner sense bit line /SBL as well as the pair of a common sense bit line CSBL and a partner common sense bit line /CSBL, it is possible to reduce loads borne by the pair of a sense bit line SBL and a partner sense bit line /SBL as well as the pair of a common sense bit line CSBL and a partner common sense bit line /CSBL.

An NMOS transistor 51 is connected between the bit line BL and the common sense bit line CSBL to serve as a BLI switch controlled by a BLI (Bit Line Isolation) signal. The bit line BL can thus be electrically disconnected from the sense amplifier 7 by putting the NMOS transistor 51 in a turned-off state.

The set/reset driver 75 is configured to include a set driver 75A and a reset driver 75B.

As shown in the circuit diagram of FIG. 10, the reset driver 75B is provided between the common sense bit line CSBL and a BL (bit line) sense node of the flip-flop sense latch circuit 71. The reset driver 75B corresponds to a voltage driver provided by the present invention to serve as a voltage driver operating in a data erase operation.

On the other hand, the set driver 75A is provided between the common sense bit line CSBL connecting the NMOS transistor 51 to the transmission gate circuits TG1 and an inverted data node of the flip-flop sense latch circuit 71. The inverted data node of the flip-flop sense latch circuit 71 is provided on a side opposite to the BL (bit line) sense node cited above with respect to the flip-flop sense latch circuit 71. The set driver 75A corresponds to a voltage driver provided by the present invention to serve as a voltage driver operating in a data write operation.

It is to be noted that the partner common sense bit line /CSBL is the output line provided for the transmission gate circuits TG1 on the same side as the inverted data node of the flip-flop sense latch circuit 71.

FIG. 11 is a circuit diagram showing a concrete configuration of the column circuit shown in the circuit diagram of FIG. 10 as the column circuit according to the first embodiment.

The concrete configuration shown in the circuit diagram of FIG. 11 is basically obtained by adding an electrical charging/discharging circuit 76 to the conceptual configuration shown in the circuit diagram of FIG. 10.

The electrical charging/discharging circuit 76 is configured to include four PMOS transistors which are denoted by reference symbols P1 to P4 respectively.

The source of the PMOS transistor P1 is connected to a line for supplying a read BL voltage VR also referred to as a read-drive voltage VR whereas the drain thereof is connected to the common sense bit line CSBL. The gate of the PMOS transistor P1 is connected to a line for supplying an inverted read pre-charge signal /PRER.

The source of the PMOS transistor P2 is connected to a line for supplying a read BL reference voltage VREFR also referred to as a read-drive reference voltage VREFR whereas the drain thereof is connected to the partner common sense bit line /CSBL. The gate of the PMOS transistor P2 is connected to the line for supplying the inverted read pre-charge signal /PRER.

The source of the PMOS transistor P3 is connected to a line for supplying a power-supply voltage Vdd whereas the drain thereof is connected to the common sense bit line CSBL. The gate of the PMOS transistor P3 is connected to a line for supplying an inverted reset signal /RESP.

The source of the PMOS transistor P4 is connected to a line for supplying a verify BL reference voltage VREFV whereas the drain thereof is connected to the partner common sense bit line /CSBL. The gate of the PMOS transistor P4 is connected to a line for supplying an inverted verify pre-charge signal /PREV.

The set driver 75A employs an inverter, a PMOS switch and an NMOS switch. The inverter has a PMOS transistor and an NMOS transistor which are connected to each other in series. The PMOS switch is a PMOS transistor for controlling connection of a specific one of the terminals of the inverter to the high-level side of a power supply. On the other hand, the NMOS switch is an NMOS transistor for controlling connection of the other terminal of the inverter to the ground GND which serves as the low-level side of the power supply. The reset driver 75B has the same configuration as the set driver 75A.

The PMOS switch employed in the set driver 75A to serve as a switch for controlling connection of the specific terminal of the inverter to the high-level side of the power supply is controlled by an inverted program BL driving pulse /BLDP which is an active low signal. On the other hand, the NMOS switch employed in the set driver 75A to serve as a switch for controlling connection of the other terminal of the inverter to the low-level side of the power supply is controlled by a program BL driving pulse BLDP which is an active high signal.

By the same token, the PMOS switch employed in the reset driver 75B to serve as a switch for controlling connection of the specific terminal of the inverter to the high-level side of the power supply is controlled by an inverted erase BL driving pulse /BLDE which is an active low signal. On the other hand, the NMOS switch employed in the reset driver 75B to serve as a switch for controlling connection of the other terminal of the inverter to the low-level side of the power supply is controlled by an erase BL driving pulse BLDE which is an active high signal.

The flip-flop sense latch circuit 71 connected between a sense bit line SBL and a partner sense bit line /SBL is a sense amplifier of the cross couple latch type.

The flip-flop sense latch circuit 71 employs two inverters which are cross-connected to each other. To put it in detail, the output terminal of a specific one of the inverters is connected to the input terminal of the other inverter whereas the input terminal of the specific inverter is connected to the output terminal of the other inverter. Each of the inverters has a PMOS transistor 21 and an NMOS transistor 22.

A PMOS transistor 23 is connected between a source common to the two PMOS transistors 21 and a line for supplying the voltage of a power supply. The PMOS transistor 23 is controlled by an inverted sense-amplifier enable signal /SAE which is an active low signal. On the other hand, an NMOS transistor 24 is connected between a source common to the two NMOS transistors 22 and a line for supplying the voltage of the ground GND. The NMOS transistor 24 is controlled by a sense-amplifier enable signal SAE which is an active high signal.

Much like the configuration of the flip-flop sense latch circuit 71, the verify latch circuit 74 is also a sense amplifier of the cross couple latch type. Each of two inverters of the verify latch circuit 74 has a PMOS transistor 21a and an NMOS transistor 22a.

Next, an inverter INVL is explained as follows. Its circuit configuration itself is identical with those of the set driver 75A and the reset driver 75B. To put it in detail, the inverter INVL employs an inverter, a PMOS switch and an NMOS switch. The inverter has a PMOS transistor and an NMOS transistor which are connected to each other in series. The PMOS switch is a PMOS transistor for controlling connection of a specific one of the terminals of the inverter to the high-level side of a power supply. On the other hand, the NMOS switch is an NMOS transistor for controlling connection of the other terminal of the inverter to the ground GND which serves as the low-level side of the power supply.

The PMOS switch for controlling connection of the specific terminal of the inverter INVL to the high-level side of the power supply is controlled by an inverted latch signal /LATCH which is an active low signal. On the other hand, the NMOS switch for controlling connection of the other terminal of the inverter INVL to the low-level side of the power supply is controlled by a latch signal LATCH which is an active high signal.

An NMOS transistor 25 for resetting the verify latch circuit 74 is connected between the ground GND and a node provided for the verify latch circuit 74 to serve as a node for controlling the PMOS side of the transmission gate circuits TG1. The NMOS transistor 25 is controlled by a latch reset signal LRES. The NMOS transistor 25 is a typical example of a reset section provided by the present invention.

In addition, a dummy load DL for the purpose of adjusting a load is imposed on the partner sense bit line /SBL which is connected to the input terminal of the set driver 75A.

It is to be noted that, as shown in the circuit diagram of FIG. 11, the column-circuit configuration has two NMOS transistors 51 provided at the top and the bottom respectively. This is because the sense amplifier 7 is shared by two memory sub-arrays. By providing the two NMOS transistors 51 in this way, it is possible to select one of the two memory sub-arrays to which the sense amplifier 7 is to be assigned.

In addition, each control signal supplied by a wire oriented in the row direction in the circuit diagram of FIG. 11 is shared by other sense amplifiers 7 which are laid out in the row direction but not shown in the circuit diagram of FIG. 11. It is desirable to provide a column-circuit configuration identical to the one shown in the circuit diagram of FIG. 11 for each of the other sense amplifiers or for every column of the memory-cell matrix.

It is to be noted that pre-charge system signals (and voltages) denoted by reference notations /PRER, /RESP, /PREV, VREFR, VREFV and VR respectively in the circuit diagram of FIG. 11 are supplied by the sense-amplifier control section 7A (or the control circuit 11) shown in the block diagram of FIG. 5.

In addition, control signals denoted by reference notations /BLDP, BLDP, /BLDE and BLDE respectively to serve as signals for controlling the set/reset driver 75 are also generated by the control circuit 11 shown in the block diagram of FIG. 5.

Data Set (or Write) Operation

Next, an operation method according to the first embodiment is explained as the method of a data set operation (also referred to as a data write operation) carried out with the lapse of time by referring to operation waveforms each shown in a timing diagram of FIGS. 12A to 12O2 to represent a timing chart. In the description of the operation method, the circuit diagram of FIG. 11 is properly referred to.

It is to be noted that, in the following description, a data set operation also known as a data write operation is also referred to a program operation in some cases. In addition, in order to prevent the explanation from becoming complicated in the following description, instead of specifying a control signal by explicitly appending a signal name to the control signal, in some cases, the control signal is indicated by merely specifying a reference notation assigned to the control signal. For example, in some cases, instead of stating a bit-line isolation signal BLI, a signal BLI is merely used and, instead of stating an inverted read pre-charge signal /PRER, a signal /PRER is merely used. This simplification of references is also applied to electric potentials and voltages as well. That is to say, instead of specifying an electric potential or a voltage by explicitly appending a name to the electric potential or the voltage, in some cases, the electric potential or the voltage is indicated by merely specifying a reference notation assigned to the electric potential or the voltage. For example, in some cases, instead of stating an electric potential appearing on the bit line BL, a BL electric potential is merely used and, instead of stating an electric potential appearing on the common sense bit line CSBL, a CSBL electric potential is merely used.

In addition, reference notation 'discharge' used in the waveform timing diagram of FIGS. 12A to 12O2 showing waveforms for the data write operation or the data set operation denotes an operation carried out after applying a voltage to a wire in order to remove the applied voltage from the wire and in order to generate a change of an electric potential appearing on the wire as an electric-potential change which is to be detected as a change occurring after setting the wire in a HiZ (high impedance) state. Usually, the voltage is applied to the wire by carrying out an electrical pre-charge operation. As an alternative, the voltage can also be applied to the wire by carrying out a power-supply Tran operation which is to be explained later by referring to a timing diagram of FIGS. 13A to 13O2. However, the 'discharge' operation can be carried out by actually charging or discharging electric charge.

The simplification of references and the meaning of reference notation 'discharge' are also applied as well to descriptions of other operations such as a data erase operation (also referred to as a data reset operation) explained later by referring to a timing diagram of FIGS. 13A to 13O2 and a data read operation explained later by referring to a timing diagram of FIGS. 14A to 14O2.

Reference notation PLT used in a waveform of FIG. 12A denotes the technical term 'plate' used so far.

A plate line PL shown in diagrams such as the diagram of FIGS. 1A and 1B are driven in an integrated manner by making use of a uniform electric potential for the entire memory array 1 or driven in an integrated manner by making use of a uniform electric potential for each of blocks (or memory sub-arrays) composing the memory array 1. Thus, there is no reason for the necessity to specify every individual electric potential used for driving a plate line PL. That is why a concept is adopted to make use of reference notation PLT in the waveform of FIG. 12A to denote the uniform electric potential. The plate line PL can be perceived as a group of plate lines PL each shown in diagrams such as the diagram of FIGS. 1A and 1B or can be assumed to have been created from a conductive layer which has a shape resembling a plate.

In a period preceding a time T0 in the waveform timing diagram of FIGS. 12A to 12O2, each of an inverted reset signal /RESP, an inverted verify signal /PREV and a bit line isolation signal BLID is sustained at the H (high) level whereas the voltages of all other signals are kept at the L (low) level such as the level of a reference voltage Vss.

In addition, a PLT electric potential is sustained at a fixed H level of FixH as shown in the waveform of FIG. 12A. On the other hand, an LIO electric potential is sustained at a fixed L level of FixL as shown in the waveform of FIG. 12B.

By the same token, each of a signal BLIU shown in the waveform of FIG. 12G1 and a signal LRES is sustained at the fixed H level of FixH whereas each of a voltage BLDE and a signal LATCH is sustained at the fixed L level of FixL as shown in the waveforms of FIG. 12H2 and 12I respectively.

Since the latch reset signal LRES is sustained at the H level as shown in the waveform of FIG. 12J, the NMOS transistor 25 employed in the column-circuit configuration shown in the circuit diagram of FIG. 11 is sustained in a turned-on state. Thus, both the transfer gate circuits TG1 and TG2 are also sustained in a turned-on state as well. In addition, since the inverted sense-amplifier enable signal /SAE is sustained at the H level as shown in the waveform of FIG. 12K, the NMOS transistor 73 employed in the column-circuit configuration shown in the circuit diagram of FIG. 11 is sustained in a turned-on state. On top of that, each of the bit-line isolation signals BLI is sustained at the H level. To put it in detail, the bit-line isolation signal BLIU is sustained at the fixed H level of FixH as shown in the waveform of FIG. 12G1 whereas the bit-line isolation signal BLID is sustained at the fixed H level prior to the time T0 as shown in the waveform of FIG. 12G2. Thus, the NMOS transistor 51 employed in the column-circuit configuration shown in the circuit diagram of FIG. 11 is sustained in a turned-on state.

Accordingly, the sense bit line SBL is sustained in a state of being connected to the bit line BL by the common sense bit line CSBL whereas the partner sense bit line /SBL is sustained in a state of being connected to the bit line BL by the partner common sense bit line /CSBL. It is to be noted that the sense bit line SBL is linked to one of two storage nodes of the flip-flop sense latch circuit 71 whereas the partner sense bit line /SBL is linked to the other storage node of the flip-flop sense latch circuit 71.

In addition, since the inverted read pre-charge signal /PRER is an active low signal which is activated when set at the L level, the PMOS transistor P1 included in the electrical charging/discharging circuit 76 employed in the column-circuit configuration shown in the circuit diagram of FIG. 11 is sustained in a turned-on state, electrically pre-charging the SBL electric potential appearing on the sense bit line SBL and the BL electric potential appearing on the bit line BL to the read-drive (read BL) voltage VR as shown in the waveforms of FIGS. 12M1 and 12N respectively.

In the mean time, the partner sense bit line /SBL is sustained in a state of being connected to the partner common sense bit line /CSBL by the transmission gate circuits TG1 which are sustained in a turned-on state.

Since the inverted read pre-charge signal /PRER is sustained at the L level, the PMOS transistor P2 shown in the circuit diagram of FIG. 11 is sustained in a turned-on state. With the PMOS transistor P2 sustained in a turned-on state, a read-drive (read BL) reference voltage VREFR denoted by reference notation VRR in the waveform timing diagram of FIGS. 12A to 12O2 is applied to the partner common sense bit line /CSBL. The voltage VRR is propagated to the partner sense bit line /SBL as shown in the waveform of FIG. 12M2.

Each of the voltage VRR (that is, the read-drive (read BL) reference voltage VREFR) and the read-drive (read BL) voltage VR is a voltage which is applied to the memory cell MC in a data read operation and a large voltage which does not result in an update disturb.

In this embodiment, the voltage VRR representing the read-drive (read BL) reference voltage VREFR is set at a magnitude a little bit greater than the read-drive (read BL) voltage VR as shown in the waveforms of FIGS. 12O1 and 12O2.

As explained earlier, in the typical configurations shown in the diagrams of FIGS. 5 and 11, the sense amplifier 7 is shared by two MATs provided on the upper side and the lower side respectively to serve as the memory sub-arrays MSA1 and MSA2 respectively.

The bit-line isolation signal BLIU controls the connection of the memory sub-array MSA1 to the sense amplifier 7 whereas the bit-line isolation signal BLID controls the connection of the memory sub-array MSA2 to the sense amplifier 7.

As shown in the waveforms of FIGS. 12G1 and 12G2, the bit-line isolation signal BLIU sustained at the H level keeps the MAT provided on the upper side in a state of being selected all the time. The bit-line isolation signal BLID is immediately set at the L level at the following time T0 in order to deselect the MAT provided on the lower side.

Thus, the NMOS transistor 51 controlled by the bit-line isolation signal BLIU is sustained in a turned-on state all the time, connecting the bit line BL to the common sense bit line CSBL continuously.

At the time T0, the inverted read pre-charge signal /PRER is changed to the H level as shown in the waveform of FIG. 12D in order to put each of the PMOS transistors P1 and P2 included in the column-circuit configuration shown in the circuit diagram of FIG. 11 in a turned-off state. Thus, the pre-charge operation is ended.

At about the same time as the time T0, as shown in the waveform of FIG. 12E, a negative pulse of the inverted reset signal /RESP is applied to the gate of the PMOS transistor P3 included in the column-circuit configuration shown in the circuit diagram of FIG. 11 in order to put the PMOS transistor P3 in a turned-on state. Thus, the common sense bit line CSBL is electrically charged to a power-supply voltage Vdd, setting each of the electric potential appearing on the sense bit line SBL and the electric potential appearing on the bit line BL at the level of the power-supply voltage Vdd as shown in the waveforms of FIGS. 12M1 and 12N respectively.

As shown in the waveforms of FIGS. 12O1 and 12O2, the read-drive (read BL) voltage VR is lower than the power-supply voltage Vdd so that each of the sense bit line SBL and the bit line BL is further pre-charged electrically.

At about the same time as the time T0, as shown in the waveform of FIG. 12F, a negative pulse of the inverted verify pre-charge signal /PREV is applied to the gate of the PMOS transistor P4 included in the column-circuit configuration shown in the circuit diagram of FIG. 11 in order to put the PMOS transistor P4 in a turned-on state. Thus, as shown in the waveform of FIG. 12M2, each of the partner common sense bit line /CSBL and the partner sense bit line /SBL is at the level of a verify BL reference voltage VREFV denoted by reference notation VRV in the waveform timing diagram of FIGS. 12A to 12O2.

As shown in the waveforms of FIGS. 12O1 and 12O2, the voltage VRV is sufficiently lower than the voltage VRR so that each of the partner sense bit line /SBL and the partner common sense bit line /CSBL is discharged electrically.

It is to be noted that the voltage VRV (that is, the verify BL reference voltage VREFV) is used as a reference voltage in a direct verify sub-operation to be described later.

The operations carried out during the period between the time T0 and a time T1 include the operation to sustain the sense bit line SBL at the H level of the power-supply voltage Vdd so as to update the initial state of the sense latch circuit at the H level.

At the time T1, the operation to continuously apply a negative pulse to the gates of the PMOS transistors P3 and P4 is ended as shown in the waveforms of FIGS. 12E and 12F respectively. Thus, the state of asserting fixed voltages on the pair of a sense bit line SBL and a partner sense bit line /SBL is also terminated as well.

As described before, the latch reset signal LRES is sustained at a fixed H level all the time as shown in the waveform of FIG. 12J. Thus, in the column-circuit configuration shown in the circuit diagram of FIG. 11, each of the NMOS transistor 25 and the transmission gate circuits TG1 is kept in a turned-on state. Up to the time T1, the turned-on state of the NMOS transistor 25 is sustaining the second node of the verify latch circuit 74 at the fixed electric potential of the ground GND. Thus, a node connected to the inverter INVL to serve as the first node of the verify latch circuit 74 is sustained at the level of the power-supply voltage Vdd.

At the time T1, as the operation to continuously apply a negative pulse to the gate of each of the PMOS transistors P3 and P4 is terminated to end the state of asserting fixed voltages on the pair of a sense bit line SBL and a partner sense bit line /SBL, the BL electric potential set at the H level of the power-supply voltage Vdd is supplied to an input terminal of the inverter INVL employed in the column-circuit structure shown in the circuit diagram of FIG. 11 so that an electric potential appearing at the first node of the verify latch circuit 74 is pulled down to the L level of the ground GND. On the other hand, the other (or second) node of the verify latch circuit 74 is about to be pulled down to the L level due to the turned-on state of the NMOS transistor 25. Since the driving power of the inverter INVL is strong, however, data held in the verify latch circuit 74 changes from the H level to the L level.

Thus, the two transmission gate circuits TG1 are turned off so that the pair of a sense bit line SBL and a partner sense bit line /SBL are relieved of loads borne by the pair of a sense bit line SBL and a partner sense bit line /SBL through the transmission gate circuits TG1 as loads on the side of the memory cell array. As shown in the waveform of FIG. 12N, the electric potential appearing on the bit line BL is put in a HiZ (high impedance) state during a period which is started at the time T1. In this HiZ state of the electric potential appearing on the bit line BL, the transmission gate circuits TG1 are sustained in a turned-off state.

During this period of time, each of the set driver 75A and the reset driver 75B is sustained in a turned-off state. Thus, a data set operation controlled through the set/reset driver 75 has not been carried out yet.

As shown in the waveform of FIG. 12K, the sense-amplifier enable signal SAE makes a transition to the H level at the time T1.

Thus, at the time T1, in a state of sustaining the H level of the power-supply voltage Vdd on the sense bit line SBL, the flip-flop sense latch circuit 71 is activated. As a result, at a program bit representing a memory cell MC, the difference in electric potential between the pair of a sense bit line SBL and a partner sense bit line /SBL increases to a maximum, which is equal to the amplitude of the power-supply voltage Vdd, as shown in the waveform of FIG. 12O1. By the same token, at an inhibit bit shown in none of the figures, the difference in electric potential between the pair of a sense bit line SBL and a partner sense bit line /SBL also increases to the maximum as shown in the waveform of FIG. 12O2. The program bit is a bit serving as a subject of a program operation mentioned before whereas the inhibit bit is not a subject of the program operation.

In addition, at the time T1, an electric potential appearing on the word line WL is set at the H level as shown in the waveform of FIG. 12C. At this point of time, each of the electric potential appearing on the bit line BL and an electric potential appearing on the plate PLT has been set at the H level so that a current does not flow to the memory cell MC. Thus, a write pulse has not been applied to the memory cell MC.

A period between a time T2 and a time T3 is a program-data input period.

At the time T2, as shown in the waveform of FIG. 12L, a positive pulse is applied to the column select line CSL of a set-subject column which is a column serving as a subject of the data set operation. Thus, in the set-subject column, the NMOS transistor 72 employed in the column-circuit configuration shown in the circuit diagram of FIG. 11 is put in a turned-on state. At that time, an electric potential appearing on the local input/output line LIO has been set at the L level as shown in the waveform of FIG. 12B. Thus, data stored in the flip-flop sense latch circuit 71 is changed from the H level to the L level as shown in the waveform of FIG. 12O1. That is to say, the column in which the data stored in the flip-flop sense latch circuit 71 is changed from the H level to the L level is a set-subject column.

In a non-set-subject column which is a column not serving as a subject of a set operation, on the other hand, the column select line CSL is not activated. Thus, an electric potential appearing on an initially set sense bit line SBL is sustained at the H level as shown in the waveform of FIG. 12O2 so as to prevent a data set operation from being carried out.

When the data stored in the flip-flop sense latch circuit 71 is changed from the H level to the L level, an electric potential appearing at the first node of the verify latch circuit 74 to represent data held by the verify latch circuit 74 is changed from the L level to the H level by way of the inverter INVL shown in FIG. 11. Thus, the two transmission gate circuits TG1 are both put in a turned-on state.

Since a period in which the sense amplifier enable signal SAE is sustained at the H level continues to a time T4, however, the turned-off state of the NMOS transistor 73 employed in the column-circuit configuration shown in the circuit diagram of FIG. 11 is sustained as it is. It is to be noted that the period in which the sense amplifier enable signal SAE is sustained at the H level is a period in which the inverted. SA enable signal /SAE is sustained at the L level.

A period between the time T3 and the time T4 is a first data set period also referred to as a first program period.

At the time T3, a positive pulse of the signal BLDP is applied as shown in the waveform of FIG. 12H1 in order to start the data set operation. In the following description, the positive pulse of the signal BLDP is also referred to as a BLDP pulse. A period in which the signal BLDP is sustained at the H level is a period in which a set DC current is flowing to the memory cell MC. The set DC current is a cell current flowing during the data write (or set) operation.

To put it in detail, when the signal BLDP is set at the H level, the set driver 75A employed in the column-circuit configuration shown in the circuit diagram of FIG. 11 is activated.

In the case of the waveform of FIG. 12O1 as a waveform indicating that a state of sustaining the sense bit line SBL at the L level is kept by the flip-flop sense latch circuit 71, the L level is inverted by the set driver 75A into the H level which results in a BL electric potential set at the L level. The BL electric potential set at the L level is then applied to the memory cell MC as a set pulse. In the waveform of FIG. 12O1, the BL electric potential being set the L level is shown as a thin solid line representing the variation of the BL electric potential which starts to drop from the level of the power-supply voltage Vdd at the time T3.

If a state of sustaining the sense bit line SBL at the H level is kept by the flip-flop sense latch circuit 71, on the other hand, a state of sustaining the BL electric potential at the H level is kept. Thus, no set pulse is applied to the memory cell MC.

A pulse applied between the bit line BL serving as the first wire and the plate line PL (or the plate PLT) serving as the second wire as a result of the application of the set pulse to the memory cell MC corresponds to a write pulse according to the present invention.

At the time T4, the signal BLDP is changed to the L level in order to end the operation to provide the memory cell MC with the set pulse which is substantially the write pulse according to the present invention as described above. At the same time, the BL electrical discharge process which is an electrical charge process in the case of this embodiment is started.

Also at the same time, the sense-amplifier enable signal SAE is set at the L level in order to put the electric potential appearing on the bit line BL in a short-circuit state in which the electric potential appearing on the bit line BL is applied to the sense bit line SBL through the common sense bit line CSBL. Thus, the electric potential appearing on the bit line BL is transferred to the sense bit line SBL through the common sense bit line CSBL. In addition, an operation to supply a power from the power supply to the flip-flop sense latch circuit 71 is stopped.

On top of that, also at the same time, a pulse of the inverted verify pre-charge signal /PREV is applied in order to electrically pre-charging the partner sense bit line /SBL at the verify BL reference voltage VREFV (that is, the voltage VRV) as shown in FIG. 12M2.

The electrical charging of the electric potential appearing on the bit line BL through the memory cell MC is observed as an electric potential increase which starts at the time T4. Thus, the electric potential appearing on the sense bit line SBL increases as shown in the waveform of FIG. 12O1.

The application of the first set pulse causes the electric potential appearing on the bit line BL to decrease to the level of the ground GND. To put it more concretely, the operation carried out at the time T3 to apply the BLDP pulse lowers the electric potential appearing on the bit line BL to the level of the ground GND. Thus, a cell current flows to the memory cell MC and, as a result, a first data transition sub-operation of the data write operation also referred to as a data set operation is carried out. By merely applying the first set pulse, however, the increase of the electric potential appearing on the bit line BL (that is, the increase of the electric potential appearing on the sense bit line SBL) is not sufficient. Thus, the first data transition sub-operation of the data write operation is not adequate.

At a time T5, the sense-amplifier enable signal SAE is set at the H level in order to put the flip-flop sense latch circuit 71 in an operative state. At the same time, the common sense bit line CSBL and the sense bit line SBL are electrically disconnected from each other.

The data held in the flip-flop sense latch circuit 71 is determined by the SBL electric potential and the /SBL electric potential which are obtained when the sense-amplifier enable signal SAE is sustained at the H level. To put it more concretely, the data held in the flip-flop sense latch circuit 71 is determined by amplifying the difference between the electric potential appearing on the sense bit line SBL and the electric potential of the verify BL reference voltage VREFV (that is, the electric potential of the voltage VRV). Since the SBL electric potential observed at the time T5 is lower than the VRV electric potential, however, the relation between the electric potential appearing on the sense bit line SBL and the electric potential appearing on the partner sense bit line /SBL is merely restored to a state which prevails prior to the time T4. This implies that by merely applying the first set pulse, the data write operation is not adequate.

In a deselected column (that is, a non-set-subject column cited before), on the other hand, the electric potential appearing on the bit line BL is sustained at the level of the power-supply voltage Vdd as it is. Thus, a success verification state of a success result of determination is sustained. That is to say, even if the BLDP pulse is applied, an inhibit state is sustained.

As described above, the waveform timing diagram of FIGS. 12A to 12O2 indicates that, at the application of the first set pulse, the electric potential appearing on the sense bit line SBL is lower than the electric potential appearing on the partner sense bit line /SBL. Thus, the L level of the electric potential appearing on the sense bit line SBL is data stored in the flip-flop sense latch circuit 71. That is to say, a large resistance of the memory cell MC indicates that the direct verify sub-operation has produced a nonsuccess determination result indicating that a data transition sub-operation has been carried out unsuccessfully. Thus, it is necessary to reapply the next pulse of the signal BLDP as the second set pulse.

In a period starting at a time T6 lagging behind the time T5 by an interval determined in advance, the operations which have been performed in a period between the time T3 and the time T6 are carried out repeatedly a predetermined plurality of times. The operations are a first data transition sub-operation initiated by a set pulse and a first direct verify sub-operation. In the case of the waveform timing diagram of FIGS. 12A to 12O2, the operation to apply a set pulse and the verify sub-operation are repeated three times. That is to say, the operation to apply a set pulse and the verify sub-operation are carried out a total of four times. A set pulse is applied in order to carry out a data transfer (that is, write) sub-operation described earlier.

In the case of the waveform timing diagram of FIGS. 12A to 12O2, with the application of the second set pulse, the second direct verify sub-operation produces a success determination result which indicates that the second data transition sub-operation has been carried out successfully. That is to say, when the sense-amplifier enable signal SAE is put in an active high state after the application of the second set pulse, the relation between the levels of the electric potential appearing on the sense bit line SBL and the electric potential appearing on the partner sense bit line /SBL is reversed during the second direct verify sub-operation as shown in the waveform of FIG. 12O1. To put it more concretely, with the sense-amplifier enable signal SAE put in an active high state during the second direct verify sub-operation, the electric potential appearing on the sense bit line SBL is increasing to the level of the power-supply voltage Vdd as indicated by a solid line whereas the electric potential appearing on the partner sense bit line /SBL is decreasing to the level of the ground GND as indicated by a dashed line.

Thus, with the sense bit line SBL set at the L level, the flip-flop sense latch circuit 71 is settled and this L level is inverted by the inverter INVL to the H level in order to update data stored in the verify latch circuit 74. As a result, the transmission gate circuits TG1 are put in a turned-off state and, at the same time, even if a BLDP pulse is applied thereafter, the electric potential appearing on the bit line BL is sustained at the level of the power-supply voltage Vdd. Thus, the inhibit state is sustained.

In the circuit according to the embodiment, the circuit has a configuration wherein, as described above, with a timing coinciding with at a point of time at which the data write operation has become sufficient, a result produced by the sense amplifier SA is used to automatically detach the input terminal of the sense amplifier from the bit line BL and the state of holding the electric potential appearing on the bit line BL is sustained so as to avoid generation of a difference in electric potential between the bit line BL and the plate line PL.

When the operation is carried out concurrently on a plurality of columns, for any particular one of the columns, the data set operation and the inhibit control included in the data set operation can be executed independently of columns other than the particular column.

As shown in the waveform timing diagram of FIGS. 12A to 12O2, after the fourth set pulse is applied, the electric potential appearing on the word line WL is restored back to the L level of the inactive state in order to end the data set operation. In addition, at the end of the data set operation, the electric potentials of a variety of signals other than the signal represented by the electric potential appearing on the word line WL are controlled to reestablish a pre-charged state which has existed prior to the time T0.

To put it more concretely, the bit line BL is electrically pre-charged in order to set the electric potential appearing on the bit line BL at an electric potential equal to the read-drive (read BL) voltage VR whereas the partner sense bit line /SBL is electrically pre-charged to set the electric potential appearing on the partner sense bit line /SBL at an electric potential equal to the voltage VRR (that is, the read-drive (read BL) reference voltage VREFR). In addition, by setting the signal BLID which has been sustained in an inactive state so far at the H level, the bit line BL in the upper and lower MATs can be electrically pre-charged.

In the case of the data set operation (also referred to as the data write operation) described above, the electric potential appearing on the bit line BL after a data transition sub-operation initiated by the application of a BLDP pulse serving as a set pulse is electrically discharged and an electric-potential change resulting from the process to electrically discharge the electric potential appearing on the bit line BL is read out by the sense amplifier 7. (It is to be noted that, in the case of this embodiment, the process to electrically discharge the electric potential appearing on the bit line BL is carried out actually by performing an electrical charge process from the plate line PL). That is to say, a special step of setting the electric potential appearing on the bit line BL in order to prepare for execution of a verify sub-operation is eliminated. In other words, a direct transition from the data transition sub-operation to the verify sub-operation is made in the verify sub-operation. The verify sub-operation carried out without the special step in accordance with the present embodiment is therefore referred to as a direct verify sub-operation in the data set operation (also referred to as the data write operation). In the case of a data set operation in which the operation to apply a BLDP pulse serving as a set pulse in order to initiate in a data transition sub-operation and the direct verify sub-operation are carried out repeatedly several times, the elimination of the special step of setting the electric potential appearing on the bit line BL in order to prepare for execution of an indirect verify sub-operation has a big effect of reducing the execution time of the data write operation.

In addition, the process to apply a set pulse, the electrical charge or discharge process, the sensing and verifying process and the inhibit control can be executed as a data write compound operation in one write cycle. When this data write compound operation is carried out concurrently on a plurality of columns, for any particular one of the columns, the compound operation can be executed independently of columns other than the particular column. Thus, even in the case of a configuration in which the write speed varies from column to column due to device variations and the like, while the write cycle is being repeated, transitions to an inhibit state can be made sequentially from cell to cell, starting from the side of a high-speed cell having a shortest data write time. As a result, the distribution of memory-cell resistances each obtained as a result of a data write operation can be contained in a narrow range.

It is to be noted that, in the present embodiment, the electric potential appearing on the bit line BL subjected to the direct verify sub-operation is changed by carrying out an electrical charge process to increase the electric potential appearing on the bit line BL from the level of the ground GND. However, the electric potential appearing on the bit line BL subjected to the direct verify sub-operation can also be changed in another way. For example, the electric potential appearing on the bit line BL is once set at the high level and the bit line BL is then electrically discharged to the low level. Subsequently, a change of the electric potential appearing on the bit line BL is detected in the direct verify sub-operation.

A data set method (also referred to as a data write method) adopted by the embodiment to carry out the data set (or write) operation described above has the following steps:

(1): Write-Pulse Application Step (Corresponding to the Data Transition Sub-Operation)

A write-pulse application step is a step of generating a memory-cell current to flow between the bit line BL serving as the first wire and the plate line PL (or the plate PLT) serving as the second wire in order to write data into the memory cell MC. Thus, a period defined between the times T3 and T4 as a period for applying a BLDP pulse serving as a write pulse as shown in the waveform timing diagram of FIGS. 12A to 12O2 is the center of the write-pulse application step. It is to be noted that, at the write-pulse application step, an initialization process can also be carried out.

(2): Read-for-Verify Step (Corresponding to the Direct Verify Sub-Operation)

A read-for-verify step is a step of setting the bit line BL serving as the first wire in a high-impedance state after the application of the write pulse and sensing an electrical change occurring on the first wire due to a current flowing through the variable-resistance cell resistor Rcell serving as the variable-resistance storage element of the memory cell MC. Thus, a period between the times T4 and T6 shown in the waveform timing diagram of FIGS. 12A to 12O2 is the period of the read-for-verify step. In this embodiment, the operation to sense an electrical change occurring in the first wire is a voltage sensing operation. It is to be noted, however, that the operation to sense an electrical change occurring in the first wire can also be a current sensing operation.

(3): Inhibit Control Step

An inhibit control step is a step of setting a state of inhibiting the sense node of the sense amplifier SA from electrically changing in the next verify sub-operation on the basis of a result of detecting an electric potential appearing at the sense node at the read-for-verify step. To put it in detail, the inhibit control step is carried out in order to determine whether or not the electrical change occurring on the first wire due to a current flowing through the variable-resistance storage element with the first wire already set in a high-impedance state shown in the waveform timing diagram of FIGS. 12A to 12O2 has exceeded a voltage VRV serving as a verify BL reference voltage VREFV in a period between the times T4 and T5 and in order to determine whether or not to carry out an operation to update data stored in the verify latch circuit 74 of the column-circuit configuration shown in the circuit diagram of FIG. 11 on the basis of a result of the determination as to whether or not the electrical change occurring on the first wire has exceeded the voltage VRV.

Data Reset (Erase) Operation

FIGS. 13A to 13O2 are a timing diagram showing waveforms each representing a timing chart of a signal used in a data reset operation (also referred to as a data erase operation) which is carried out in accordance with the first embodiment.

Prior to the data reset operation started at a time T0 shown in the waveform timing diagram of FIGS. 13A to 13O2, the PLT electric potential appearing on the plate line PL is sustained in a state equivalent to the state of the power-supply voltage Vdd as shown in the waveform of FIG. 13A. In addition, the signals BL which are the signals BLIU and BLID are sustained at the H level whereas the inverted read pre-charge signal /PRER is sustained at the L level as shown in the waveforms of FIGS. 13G1, 13G2 and 13D respectively. Thus, each of the NMOS transistor 51 and the PMOS transistor P1 which are employed in the column-circuit configuration shown in the circuit diagram of FIG. 11 is sustained in a turned-on state whereas the electric potential appearing on the bit line BL is sustained in a state of being already pre-charged to the level of the read-drive (read BL) voltage VR as shown in the waveform of FIG. 13N.

The read-drive (read BL) voltage VR is a voltage applied to the memory cell MC in a data read operation. The read-drive (read BL) voltage VR is a voltage which does not cause an update disturb.

In addition, since the latch reset signal LRES is sustained at the H level as shown in the waveform of FIG. 13J, the NMOS transistor 25 employed in the column-circuit configuration shown in the circuit diagram of FIG. 11 is sustained in a turned-on state. As a result, each of the two transmission gate circuits TG1 is also sustained in a turned-on state as well. In addition, since the inverted read pre-charge signal /PRER is sustained at the L level as shown in the waveform of FIG. 13F, the PMOS transistor P2 employed in the column-circuit configuration shown in the circuit diagram of FIG. 11 is sustained in a turned-on state and an SA node connected to the partner sense bit line /SBL to serve as a reference in the data read operation is sustained in a state of being already pre-charged to the level of the voltage VRR serving as the read-drive (read BL) reference voltage VREFR.

By putting the NMOS transistor 25 in a turned-on state, the verify latch circuit 74 is reset. The reset state of the verify latch circuit 74 is a reset verify pass state or the turned-on state of the transmission gate circuits TG1. In addition, as will be described later in detail, the verify latch circuit 74 is configured to be capable of entering a reversed state which is the reverse of the reset verify pass state in accordance with a sensing result produced by the flip-flop sense latch circuit 71. Thus, it is not necessary to apply an additional reset pulse which is not required for an MC (memory cell) bit passing in a pre-read operation to be carried out next.

As shown in the waveforms of FIGS. 13M1 to 13M4 and 13O1 and 13O2, it is obvious that an electric potential appearing on the sense bit line SBL is sustained at the VR level whereas an electric potential appearing on the partner sense bit line /SBL is sustained at the VRR level. It is to be noted that, in the waveforms of FIGS. 13M1 to 13M4, symbol (E) appended as a suffix to a signal indicates that the signal is relevant to the bit of a memory cell serving as a subject of the data erase operation whereas symbol (I) appended as a suffix to a signal indicates that the signal is relevant to the bit of a memory cell serving as a subject of the data-erase inhibit operation.

When the data erase operation is started, first of all, at the time T0, the PLT electric potential is inverted to the level of the reference voltage Vss as shown in the waveform of FIGS. 13A. The PLT electric potential is inverted because it is assumed that the ReRAM, carries out a bipolar operation so that the current must flow through the memory cell MC in a direction opposite to the direction of the current in the data set operation. The bipolar operation is a 2-pole operation in which the direction of the flow of the current through the memory cell MC can be reversed.

In addition, following the change of the PLT electric potential to the reference voltage Vss, each of the read-drive (read BL) voltage VR used in the data read operation and the voltage VRR serving as a read-drive (read BL) reference voltage VREFR used in the data read operation is changed to an optimum value as shown in the waveforms of FIGS. 13O1 and 13O2. The control to change the read-drive (read BL) voltage VR and the read-drive (read BL) reference voltage VREFR is executed by a voltage control circuit employed in a drive control section. It is to be noted that the voltage control circuit itself is shown in none of the figures. In this embodiment, each of the read-drive (read BL) voltage VR used in the data read operation and the voltage VRR serving as a read-drive (read BL) reference voltage VREFR used in the data read operation is reduced to a low level. In the waveform timing diagram of FIGS. 13A to 13O2, the control to drive each of the read-drive (read BL) voltage VR and the read-drive (read BL) reference voltage VREFR to a low level is denoted by reference phrase "power-supply Tran."

As a result, each of the bit line BL and the partner sense bit line /SBL makes a transition to a read voltage of the data reset operation.

Next, at a time T1, the latch reset signal LRES is changed to the L level as shown in the waveform of FIG. 13J. When the latch reset signal LRES is changed to the L level, the NMOS transistor 25 employed in the column-circuit configuration shown in the circuit diagram of FIG. 11 is put in a turned-off state, terminating the reset state of the verify latch circuit 74.

At about the same time as the time T1, the bit-line isolation signal BLID is changed to the L level as shown in the waveform of FIG. 13G2, detaching the MAT provided on the lower side from the sense amplifier SA.

In addition, at about the same time as the time T1, the inverted read pre-charge signal /PRER is changed to the H level as shown in the waveform of FIG. 13D whereas the electric potential appearing on the word line WL including a bit to be erased is changed to the H level as shown in the waveform of FIG. 13C. The bit to be erased is the bit corresponding to a memory cell MC serving as a subject of the data erase operation. Thus, an operation to discharge electrical charge from the bit line BL is started as shown in the waveform of FIG. 13O1. It is to be noted that the bit line BL has been electrically pre-charged to the read-drive (read BL) voltage VR.

Since an electric potential appearing on the word line WL connected to a memory cell MC of a bit serving as a subject of the data-erase inhibit operation is sustained at the L level as it is as shown in the waveform of FIG. 13O2, on the other hand, the process of discharging electric charge from the bit line BL connected to the memory cell MC is not carried out.

After the electrical discharge process has been carried out for a period determined in advance, at a time T2, an electric potential appearing on the sense-amplifier enable signal SAE is changed to the H level as shown in the waveform of FIG. 13K. When the electric potential appearing on the sense-amplifier enable signal SAE is changed to the H level, the NMOS transistor 73 employed in the column-circuit configuration shown in the circuit diagram of FIG. 11 is put in a turned-off state whereas the flip-flop sense latch circuit 71 is activated. Thus, the flip-flop sense latch circuit 71 carries out a sensing operation to amplify a difference in electric potential between the pair of a sense bit line SBL and a partner sense bit line /SBL to the amplitude of the power-supply voltage Vdd, setting sensed data in a determinate state. The sensed data set in the typical waveform of FIG. 13O1 as data sensed by the pair of a sense bit line SBL and a partner sense bit line /SBL for a bit serving as a subject of the data erase operation is data obtained by inverting the sensed data set in the typical waveform of FIG. 13O2 as data sensed by the pair of a sense bit line SBL and a partner sense bit line /SBL for a bit serving as a subject of the data-erase inhibit operation. In the following description, the bit serving as a subject of the data erase operation is referred to an erase bit or an erase cell whereas the bit serving as a subject of the data-erase inhibit operation is referred to as an erase inhibit bit or an erase inhibit cell.

In the case of an already reset bit (that is, an erase bit or the bit of a memory cell MC serving as a subject of the data erase operation) shown in the waveform of FIG. 13O1, the L-level state of the sense bit line SBL is data stored in the flip-flop sense latch circuit 71.

In the case of a set bit (that is, an erase inhibit bit, an erase inhibit cell or the bit of a memory cell MC serving as a subject of the data-erase inhibit operation) shown in the waveform of FIG. 13O2, on the other hand, the set state of the pair of a sense bit line SBL and a partner sense bit line /SBL is sustained as it is. Thus, the H-level state of the sense bit line SBL is data stored in the flip-flop sense latch circuit 71.

Since it is not necessary to apply an additional reset pulse which is not required for an already reset bit of a memory cell MC, this initial read operation is carried out.

Then, at a time T3, a pulse of the latch signal LATCH is applied in order to store information, which indicates whether or not a verify condition has been passed at least once as evidenced by a success determination result described earlier, in the verify latch circuit 74. To put it more concretely, when the latch signal LATCH is changed to the H level at the time T3, the inverter INVL employed in the column-circuit configuration shown in the circuit diagram of FIG. 11 is activated.

Thus, in a column circuit including an already reset bit of a memory cell MC serving as a subject of the data erase operation, the information stored in the verify latch circuit 74 is inverted by the activated inverter INVL and each of the transmission gate circuits TG1 is put in a turned-off state. In a column circuit including an erase inhibit bit of a memory cell MC serving as a subject of the data-erase inhibit operation, on the other hand, the erase inhibit bit has a pair of a sense bit line SBL and a partner sense bit line /SBL with the state thereof sustained as it is. Thus, the electric potential appearing on the sense bit line SBL is set at the H level of the power-supply voltage Vdd as shown in the waveform of FIG. 13O2. Therefore, the reset state of the verify latch circuit 74 does not change whereas each of the transmission gate circuits TG1 is sustained in a turned-on state as it is.

The operations described so far are an initial read operation which is carried out prior to the data reset operation itself.

Then, at a time T4, a positive pulse of the signal BLDE is applied. In the following description, the positive pulse of the signal BLDE is also referred to as a BLDE pulse. The BLDE pulse is a reset pulse making a request for a direct start of the data reset operation also referred to as the data erase operation as described before. The BLDE pulse is applied in order to activate the reset driver 75B employed in the column-circuit configuration shown in the circuit diagram of FIG. 11.

A pulse substantially applied between the bit line BL serving as the first wire and the plate line PL (or the plate PLT) serving as the second wire as a result of the application of the BLDE pulse is the erase pulse according to the present invention.

During a period in which the signal BLDE is sustained at the H level, a reset DC current is thus flowing to the memory cell MC.

If the H level of the sense bit line SBL shown in the waveform of FIG. 13O2 given for an erase inhibit cell (or an erase inhibit bit) is sustained by the flip-flop sense latch circuit 71, the electric potential appearing on the bit line BL needs to be sustained in state of the L level. Thus, the set/reset driver 75 activated by the signal BLDE does not apply a reset pulse.

If the L level of the sense bit line SBL shown in the waveform of FIG. 13O1 given for an erase cell (or an erase bit) is sustained by the flip-flop sense latch circuit 71, on the other hand, the set/reset driver 75 applies a reset pulse. Thus, the electric potential appearing on the bit line BL is inverted from the L level to the H level.

As described above, logic used in a sensed state following the application of the reset pulse as logic for feeding back the inhibit control from a determination result produced by the direct verify sub-operation to the voltage applied to the bit line BL at a reset time is the inversion of logic used in a sensed state for an erase inhibit cell. It is thus necessary to provide the verify latch circuit 74 to serve as a latch circuit for storing information which indicates whether or not a verify condition has been passed at least once.

In the case of a memory cell MC serving as a subject of the data erase operation, an attempt is made to transfer the inverted electric potential of the electric potential appearing on the bit line BL to the sense bit line SBL by way of the transmission gate circuits TG1 which each have already been set in a turned-on state. At that time, however, the sense-amplifier enable signal SAE is sustained at the H level so that the NMOS transistor 73 is sustained in a turned-off state. Thus, only the electric potential appearing on the bit line BL increases while the electric potential appearing on the sense bit line SBL is sustained in the state of the L level. In addition, the H-level state of data stored in the verify latch circuit 74 is sustained.

Then, at a time T5, the signal BLDE is set at the L level in order to terminate the operation to apply the reset pulse and, at the same time, start a BL electrical charge operation which is referred to as an electrical discharge operation in the explanation of the present embodiment.

At the same time as the time T5, the sense-amplifier enable signal SAE is changed from the H level to the L level in order to put the NMOS transistor 73 employed in the column-circuit configuration shown in the circuit diagram of FIG. 11 in a turned-on state and put the electric potential appearing on the bit line BL in a short-circuit state of being applied to the sense bit line SBL through the common sense bit line CSBL. Thus, the electric potential appearing on the bit line BL is transferred to the sense bit line SBL through the common sense bit line CSBL. In addition, an operation to supply power from the power supply to the flip-flop sense latch circuit 71 is stopped.

Also at the same time as the time T5, a pulse of the inverted verify pre-charge signal /PREV is applied in order to electrically pre-charge the partner sense bit line /SBL (E) of the column serving as a subject of the data erase operation to the voltage VRV serving as the verify BL reference voltage VREFV as shown in the waveform of FIG. 13M2.

The electric potential appearing on the bit line BL experiences an electrical discharge process (that is, exhibits an electric-potential decreasing phenomenon) which takes place through the memory cell MC, being observed to start at a time T5. Thus, the electric potential appearing on the sense bit line SBL starts to decrease as shown in the waveform of FIG. 13O1.

By applying the first reset pulse (or to put it more concretely, by applying the BLDE pulse) at the time T4 as described above, the electric potential appearing on the bit line BL is increased to the level of the power-supply voltage Vdd. Thus, a cell current flows to the memory cell MC in execution of the first data transition sub-operation of the data erase operation also referred to as the data reset operation. In the typical timing diagram of FIGS. 13A to 13O2, the application of the first reset pulse causes the electric potential appearing on the bit line BL (and, thus, the electric potential appearing on the sense bit line SBL) to decrease considerably.

Then, at a time T6, the sense-amplifier enable signal SAE is set at the H level in order to operate the flip-flop sense latch circuit 71. At the same time, the common sense bit line CSBL and the sense bit line SBL are electrically disconnected from each other.

The data held in the flip-flop sense latch circuit 71 is determined by two electric potentials which appear on the sense bit line SBL and the partner sense bit line /SBL respectively in a state of sustaining the sense-amplifier enable signal SAE at the H level. That is to say, the data held in the flip-flop sense latch circuit 71 is determined by amplifying a difference between the electric potential appearing on the sense bit line SBL and the electric potential of the voltage VRV serving as the verify BL reference voltage VREFV. In the case of the typical waveform of FIG. 13O1, the electric potential appearing on the bit line BL is decreased whereas the voltage VRV representing the verify BL reference voltage VREFV is set in such a way that the relation between the levels of the electric potential appearing on the sense bit line SBL and the electric potential appearing on the partner sense bit line /SBL is reversed. After the relation between the levels of the electric potential appearing on the sense bit line SBL and the electric potential appearing on the partner sense bit line /SBL has been reversed, the difference between the electric potential appearing on the sense bit line SBL and the electric potential of the voltage VRV serving as the verify BL reference voltage VREFV is amplified to the amplitude of the power-supply voltage Vdd during a period which starts at the time T6. Also after the first reset pulse has been applied, a large current flows to the memory cell MC, resulting in a large voltage drop of the electric potential appearing on the bit line BL. Thus, the reversal of the relation between the levels of the electric potential appearing on the sense bit line SBL and the electric potential appearing on the partner sense bit line /SBL implies that the data erase operation carried out by applying the first reset pulse has not produced a sufficient result yet.

In the column not serving as a subject of the data reset operation, on the other hand, the electric potential appearing on the bit line BL is sustained at the level of the power-supply voltage Vdd as it is. Thus, a success determination result produced by the direct verify sub-operation state is sustained. That is to say, even if the BLDE pulse is applied, an inhibit state is sustained.

As described above, in the waveform timing diagram of FIGS. 13A to 13O2, by applying the first reset pulse, the electric potential appearing on the sense bit line SBL is made lower than the electric potential appearing on the partner sense bit line /SBL. Thus, the L level of the electric potential appearing on the sense bit line SBL is data stored in the flip-flop sense latch circuit 71. That is to say, a low resistance of the variable-resistance cell resistor Rcell employed in the memory cell MC to serve as a variable-resistance storage element indicates a non success determination result produced in the direct verify sub-operation. For this reason, the next BLDE pulse is applied as another reset pulse.

Then, at a time T7, a pulse of the latch signal LATCH is applied to the inverter INVL employed in the column-circuit configuration shown in the circuit diagram of FIG. 11. A decision as to whether or not to invert data stored in the verify latch circuit 74 is made in accordance with the determination result produced in the direct verify sub-operation. To put it more concretely, in the case of the waveform shown in FIG. 13O1 in which the direct verify sub-operation produces a fail (that is nonsuccess or no-go) result of determination, with the change of the electric potential appearing on the sense bit line SBL to the L level, the data stored in the verify latch circuit 74 is sustained at the H level. In addition, the turned-on state of each of the transmission gate circuits TG1 is also sustained as well thereafter. Thus, also at each point of time to start any one of the second and subsequent data transition sub-operations of the data reset operation, the initial state leading ahead of the first data transition sub-operation of the data reset operation is sustained.

As is obvious from a later description of the second data transition sub-operation of the data reset operation, on the other hand, in the case of a pass (success) determination result of the direct verify sub-operation, the electric potential appearing on the sense bit line SBL is set at the H level. Thus, the data stored in the verify latch circuit 74 is inverted from the H level to the L level by the inverter INVL which is controlled by the latch signal LATCH. As will be described later in detail, each of the transmission gate circuits TG1 is thus sustained in a turned-off state and no subsequent data transition sub-operations of the data reset operations are carried out. That is to say, the data transition sub-operations of the data reset operation are put in a state of being inhibited.

After a time T8 lagging behind the time T7 by a time period determined in advance, the latch reset process, the reset-pulse applying process and the verify sub-operation which have been carried out in the period between the time T4 and the time T8 are performed repeatedly a predetermined plurality of times. In the case of the waveform timing diagram of FIGS. 13A to 13O2, the latch reset process, the reset-pulse applying process and the verify sub-operation are repeated three times. That is to say, the latch reset process, the reset-pulse applying process and the verify sub-operation are carried out a total of four times.

In the waveform timing diagram of FIGS. 13A to 13O2, the BLDE pulse asserted throughout the period between the time T8 and a time T9 as the second reset pulse results in a success determination result of the direct verify sub-operation. To put it more concretely, in the electrical discharge process taking place at the time T9, the decrease of the electric potential appearing on the bit line BL is not so observed. The fact that the decrease of the electric potential appearing on the bit line BL is not so observed implies that a transition has been made by the memory cell MC to a state of exhibiting a high cell resistance Rc due to the application of the second reset pulse. The state of exhibiting a high cell resistance Rc of the variable-resistance cell resistor Rcell employed in the memory cell MC is perceived to be a state in which data has already been erased from the variable-resistance storage element, which is the variable-resistance cell resistor Rcell itself. Thus, by starting a direct verify sub-operation at a time T10, in the H-level state of the sense bit line SBL, data stored in the flip-flop sense latch circuit 71 is made determinate.

As the data stored in the flip-flop sense latch circuit 71 is determined to be data of the H level, application of a pulse of the latch signal LATCH at a time T11 inverts data stored in the verify-pass latch circuit 74 from the H level to the L level. Then, each of the transmission gate circuits TG1 is put in a turned-off state so that an electric-potential change caused by application of any of the third and subsequent BLDE pulses, which each serve as a reset pulse, as a change in BL electric potential is blocked from the input terminal the flip-flop sense latch circuit 71. The operation to prevent any change in BL electric potential from entering the flip-flop sense latch circuit 71 is referred to as an operation to establish an inhibit state. The inhibit state is sustained thereafter in order to keep the pass state held by the flip-flop sense latch circuit 71.

In the waveform timing diagram of FIGS. 13A to 13O2, the data reset operation is terminated after the fourth reset pulse has been applied. At the end of the data reset operation, a transition is made to the "power-supply Tran" state described earlier.

In the "power-supply Tran" state, the electric potential appearing on the bit line BL is equal to the read-drive (read BL) voltage VR whereas the partner sense bit line /SBL is electrically pre-charged to the electric potential of the read-drive (read BL) reference voltage VREFR. In addition, the bit-line isolation signal BLID which has been sustained in an inactive state is set at the H level. Thus, the bit line BL of the two MATs is electrically pre-charged. On top of that, the electric potential appearing on the plate line PL is restored to the level of the power-supply voltage Vdd.

In the data reset operation (that is, the data erase operation) described above, the electric potential appearing on the bit line BL after the application of a BLDE pulse serving as a reset pulse is subjected to an electrical charge process. (It is to be noted that, in the case of this embodiment, the process to electrically charge the electric potential appearing on the bit line BL is carried out actually by performing an electrical discharge process from the plate line PL). At that time, a change of the electric potential appearing on the bit line BL is read out right away by the sense amplifier SA in the so-called verify sub-operation. That is to say, a special step of setting the electric potential appearing on the bit line BL in order to carry out a verify sub-operation is eliminated. In other words, a direct transition to the verify sub-operation is made in the data erase operation. The verify sub-operation without the special step is therefore referred to as a direct verify sub-operation in the data reset operation (also referred to as the data erase operation). In the case of a data reset operation in which the process to apply a reset pulse to initiate the data transition sub-operation and the verify sub-operation are carried out repeatedly several times, the elimination of the special step of setting the electric potential appearing on the bit line BL in order to carry out a verify sub-operation has a big effect of reducing the execution time of the data erase operation.

In addition, the process to apply a reset pulse, the electrical charge or discharge process, the sensing and verifying process and the inhibit control can be executed as a data erase compound operation in one erase cycle. When this data erase compound operation is carried out concurrently on a plurality of columns, for any particular one of the columns, the compound operation can be executed independently of columns other than the particular column. Thus, even in the case of a configuration in which the erase speed varies from column to column due to device variations and the like, while the erase cycle is being repeated, transitions to an inhibit state can be made sequentially from cell to cell, starting from the side of a high-speed cell having a shortest data erase time. As a result, the distribution of memory-cell resistances obtained as a result of the data erase operation can be contained in a narrow range.

It is to be noted that, in the present embodiment, the electric potential appearing on the bit line BL subjected to the verify sub-operation is changed by carrying out an electrical discharge process to decrease the electric potential appearing on the bit line BL from the level of the power-supply voltage Vdd. However, the electric potential appearing on the bit line BL subjected to the verify sub-operation can also be changed in another way. For example, the electric potential appearing on the bit line BL is once set at the low level and the bit line BL is then electrically charged to the high level. Subsequently, a change of the electric potential appearing on the bit line BL is detected in the direct verify sub-operation.

A data reset method (also referred to as a data erase method) adopted by the embodiment to carry out the data erase operation described above has the following steps:

(1): Erase-Pulse Application Step (Corresponding to the Data Transition Sub-Operation)

An erase-pulse application step is a step of generating a memory-cell current to flow between the bit line BL serving as the first wire and the plate line PL (or the plate PLT) serving as the second wire in order to erase data from the memory cell MC. Thus, a period defined between the times T4 and T5 as a period for applying a BLDE pulse serving as an erase pulse as shown in the waveform timing diagram of FIGS. 13A to 13O2 is the center of the erase-pulse application step. It is to be noted that, at the erase-pulse application step, an initialization process can also be carried out.

(2): Read-for-Verify Step (Corresponding to the Direct Verify Sub-Operation)

A read-for-verify step is a step of setting the bit line BL serving as the first wire in a high-impedance state after the application of the erase pulse and sensing an electrical change occurring on the first wire due to a current flowing through the variable-resistance cell resistor Rcell serving as the variable-resistance storage element of the memory cell MC. Thus, a period between the times T5 and T7 shown in the waveform timing diagram of FIGS. 13A to 13O2 are the period of the direct read-for-verify step. In this embodiment, the operation to sense an electrical change occurring in the first wire is a voltage sensing operation. It is to be noted, however, that the operation to sense an electrical change occurring in the first wire can also be a current sensing operation.

(3): Inhibit Control Step

An inhibit control step is a step of setting a state of inhibiting the sense node of the sense amplifier SA from electrically changing in the next verify sub-operation on the basis of a result of detecting an electric potential appearing at the sense node at the read-for-verify step. To put it in detail, at the inhibit control step, operations are carried out in a period between the times T7 and T8 shown in the waveform timing diagram of FIGS. 13A to 13O2 to activate the latch signal LATCH in order to update data stored in the verify latch circuit 74 of the column-circuit configuration shown in the circuit diagram of FIG. 11 on the basis of a sensed voltage obtained as a result of the detection of the electric potential appearing at the sense node.

In this embodiment, the detection timing of the inhibit control step executed during the data write operation also referred to as the data set operation is different from the detection timing of the inhibit control step executed during the data erase operation also referred to as the data reset operation. To put it in detail, the inhibit control step in the data set operation is executed prior to the voltage sensing operation whereas the inhibit control step in the data reset operation is executed on the basis of a result of the voltage sensing operation, that is, on the basis of a voltage amplified to the amplitude of the power-supply voltage Vdd. However, the inhibit control step in the data set operation is executed prior to the voltage sensing operation with a detection timing which is set arbitrarily. By the same token, the inhibit control step in the data reset operation is executed after the voltage sensing operation with a detection timing which is also set arbitrarily. In the present embodiment, with regard to the detection timing of the inhibit control, the phrase stating "at the read-for-verify step" in the descriptions explaining the two different inhibit control steps of the data write operation and the data erase operation respectively implies a time before the voltage sensing operation for the data write operation or after the voltage sensing operation to amplify a signal to the amplitude of the power-supply voltage Vdd for the data erase operation.

Data Read Operation

FIGS. 14A to 14O2 are a timing diagram showing waveforms each representing a timing chart of a signal used in a data read operation which is carried out in accordance with the first embodiment. In particular, FIG. 14O1 shows a waveform of a set bit representing a memory cell MC put in a written state also referred to as a set state or a small-resistance state whereas FIG. 14O2 shows a waveform of a reset bit representing a memory cell MC put in an erased state also referred to as a reset state or a large-resistance state.

Throughout the read operation shown in the waveform timing diagram of FIGS. 14A to 14O2, each of the electric potential appearing on the plate line PL, the inverted reset signal /RESP, the inverted verify pre-charge signal /PREV, the bit-line isolation signal BLIU and the latch reset signal LRES is sustained at a fixed H level of FixH as shown in the waveforms of FIGS. 14A, 14E to 14G1 and 14J respectively. On the other hand, each of the signal BLDP, the signal BLDE and the latch signal LATCH is sustained at a fixed L level of FixL as shown in the waveforms of FIGS. 14H1, 14H2 and 14I respectively. Thus, the PMOS transistors P3 and P4 each employed in the electrical charging/discharging circuit 76 included in the column-circuit configuration shown in the circuit diagram of FIG. 11 to serve as a transistor used in the data write and/or erase operations are not operating. In addition, the inverter INVL, the set driver 75A and the reset driver 75B are also not operating either.

Since the latch reset signal LRES is fixed at the H level, the verify latch circuit 74 is keeping the H-data holding state whereas each of the two transmission gate circuits TG1 is sustaining a turned-on state throughout the read operation.

Since the bit-line isolation signal BLID is sustained at the L level during a data read period between a time T1 and a time T3, the upper-side MAT including the memory cell MC shown in the circuit diagram of FIG. 11 becomes a subject of the data read operation. On the other hand, the lower-side MAT not shown in the circuit diagram of FIG. 11 is deselected.

In a data read period leading ahead of the time T0, an active-low inverted read pre-charge signal /PRER is sustained at the L level as shown in the waveform of FIG. 14D. Thus, both the PMOS transistors P1 and P2 included in the column-circuit configuration shown in the circuit diagram of FIG. 11 are sustained in a turned-on state. In the same data read period, both the signals BLI (that is, the signals BLIU and BLID) are sustained at the H level. Thus, the NMOS transistor 51 included in the column-circuit configuration shown in the circuit diagram of FIG. 11 is sustained in a turned-on state.

As a result, as shown in the waveform of FIG. 14N, the bit line BL is electrically pre-charged through the PMOS transistor P1 put in the turned-on state, the common sense bit line CSBL and the NMOS transistor 51 put in the turned-on state so as to set the electric potential appearing on the bit line BL at the read-drive (read BL) voltage VR. In addition, the read-drive (read BL) voltage VR is also propagated to the sense bit line SBL by way of the transmission gate circuits TG1 put in the turned-on state as shown in the waveforms of FIGS. 14M1, 14O1 and 14O2.

On top of that, the partner sense bit line /SBL is electrically pre-charged to the read-drive (read BL) reference voltage VREFR denoted by symbol VRR through the PMOS transistor P2 put in the turned-on state as shown in the waveforms of FIGS. 14M2, 14O1 and 14O2.

At the time T0, the bit-line isolation signal BLID is set at the L level in order to detach a load imposed by the MAT provided on the lower side so as to establish a state for reading out data from the MAT provided on the upper side.

In addition, the inverted read pre-charge signal /PRER makes a transition to the H-level state, putting the PMOS transistor P1 in a turned-off state. At about the same time, the electric potential appearing on the word line WL is changed to the H level in order to start a process of electrically charging the bit line BL.

Since the set bit shown in the waveform of FIG. 14O1 is in a small-resistance state, an increase in electric potential is observed and an electric potential appearing between the pair of a sense bit line SBL and a partner sense bit line /SBL is inverted. In the case of a reset bit, on the other hand, a relation shown in the waveform of FIG. 14O2 as the relation between the levels of the electric potential appearing on the sense bit line SBL and the electric potential appearing on the partner sense bit line /SBL does not change.

At a time T1 lagging behind the time T0 by a fixed interval during which the bit line BL is electrically pre-charged, the sense-amplifier enable signal SAE is set at the H level in order to start a data sensing sub-operation of the data read operation. Thus, data stored in the flip-flop sense latch circuit 71 is confirmed.

The data stored in the flip-flop sense latch circuit 71 is transferred to the pair of a local IO line LIO and a partner local IO line /LIO which have been electrically pre-charged to the power-supply voltage Vdd by applying a pulse to the column select line CSL at a time T2.

This state is the so-called active state of the DRAM. In this state, the data stored in the flip-flop sense latch circuit 71 can be accessed sequentially at a high speed on the rising edge of a signal appearing on the column select line CSL.

Finally, at a time T3, the bit line BL is electrically pre-charged again in order to terminate the data read operation.

2: Second Embodiment

Figure 15:
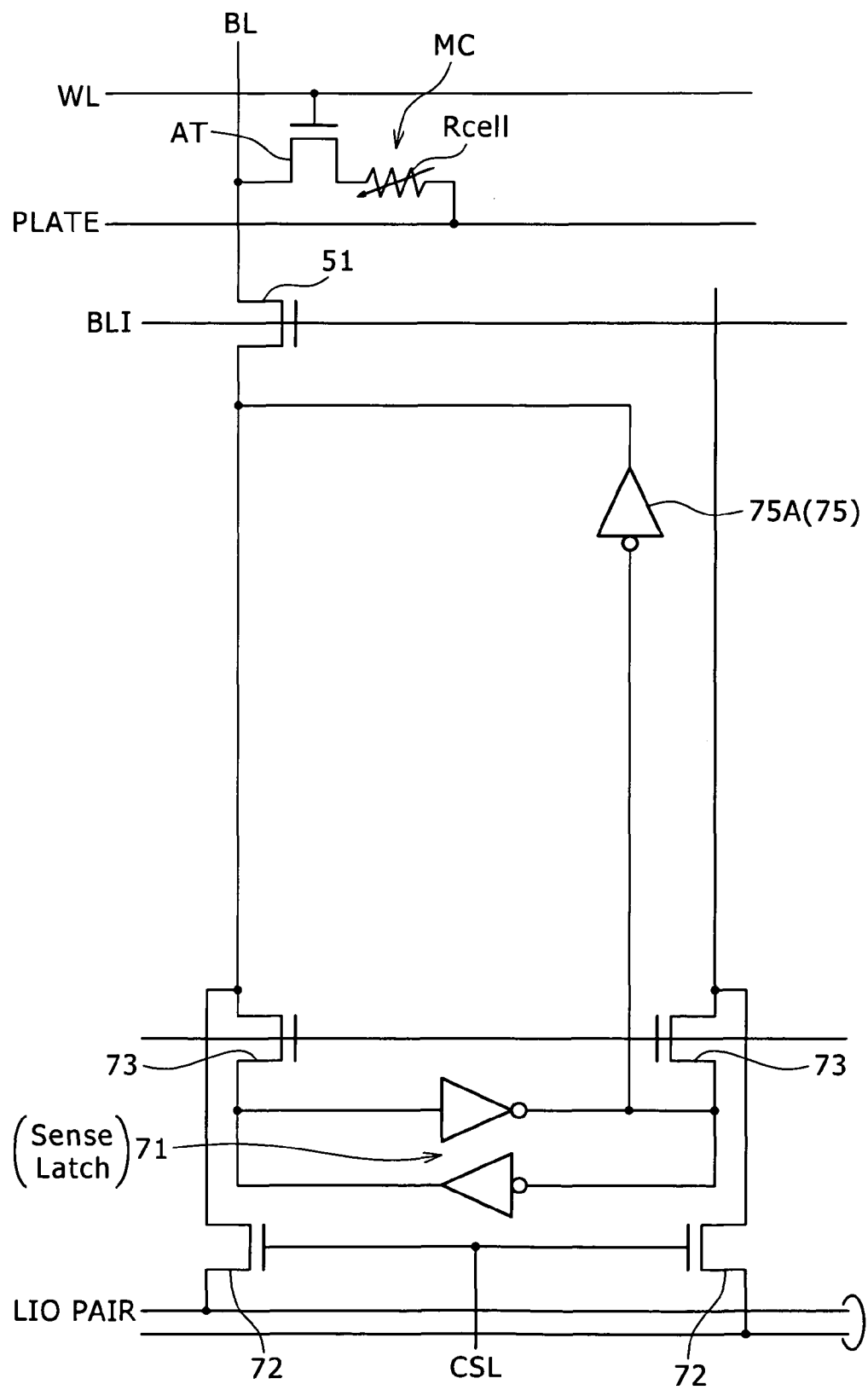
FIG. 15 is a conceptual diagram showing the configuration of a column circuit employed in the memory device according to the second embodiment.

FIG. 15 is a conceptual diagram showing the configuration of a column circuit according to a second embodiment.

The second embodiment is different from the first embodiment in that, in the case of the second embodiment, the reset-pulse inhibit control based on a determination result of a direct verify sub-operation of the data reset operation is not carried out by the sense-amplifier section.

In the case of the second embodiment, the direct verify sub-operation following application of a reset pulse in the data reset operation is carried out by executing a dynamic verify sub-operation and a determination result produced in the direct verify sub-operation is stored in the flip-flop sense latch circuit 71. Then, the determination result stored in the flip-flop sense latch circuit 71 is once transferred to another logic circuit block through a pair of a local input/output line LIO and a partner local IO line /LIO.

In comparison with the column circuit shown in the diagram of FIG. 10, the column circuit shown in the diagram of FIG. 15 employs a set driver 75A in place of the set/reset driver 75 included in the column circuit shown in the diagram of FIG. 10. In addition, the inverter INVL and the verify latch circuit 74 which are employed in the column circuit shown in the diagram of FIG. 10 are no longer included in the column circuit shown in the diagram of FIG. 15.

A new logic circuit block provided as a consequence of the simplification of the column circuit shown in the diagram of FIG. 10 to give the column circuit shown in the diagram of FIG. 15 can be wired between the write/erase driver 10 and the I/O buffer 9 as well as between the main amplifier 13 and the I/O buffer 9 in the configuration shown in the block diagram of FIG. 5. The new logic circuit block may receive control signals directly from the control circuit 11 or control signals based on a decoding result produced by the CSW driver 6.

The new logic circuit block corresponds to a second control section provided by the present invention. On the other hand, the set/reset drivers 75, which are configured to include the set driver 75A and the reset driver 75B as described before, as well as the two transmission gate circuits TG1 correspond to an inhibit control section provided by the present invention. The set/reset drivers 75 and the two transmission gate circuits TG1 are sections each corresponding to the first embodiment. In addition, a configuration including the set driver 75A according to the second embodiment corresponds to a typical first control section provided by the present invention.

More detailed operations carried out by the second embodiment are explained as follows.

Figure 16:
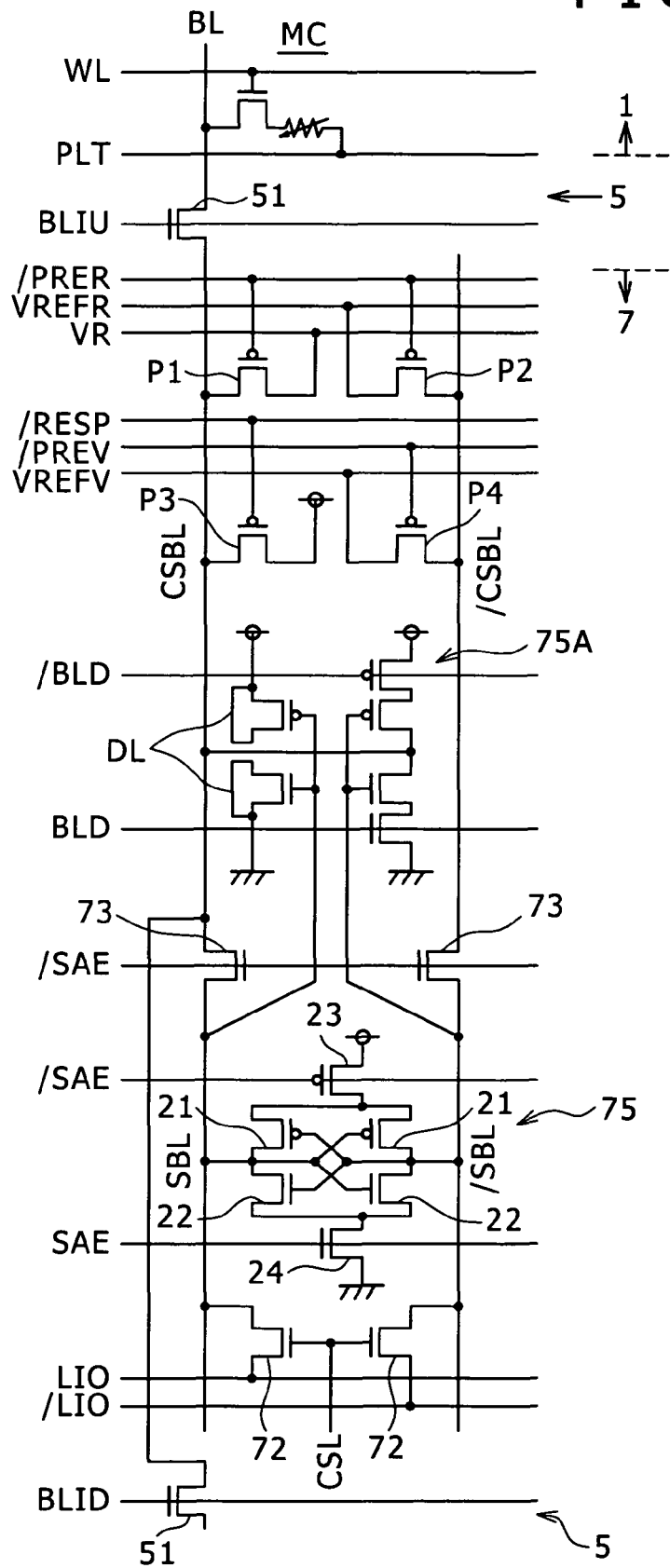
FIG. 16 is a circuit diagram showing the configuration of the column circuit employed in the memory device according to the second embodiment.
Figure 17:
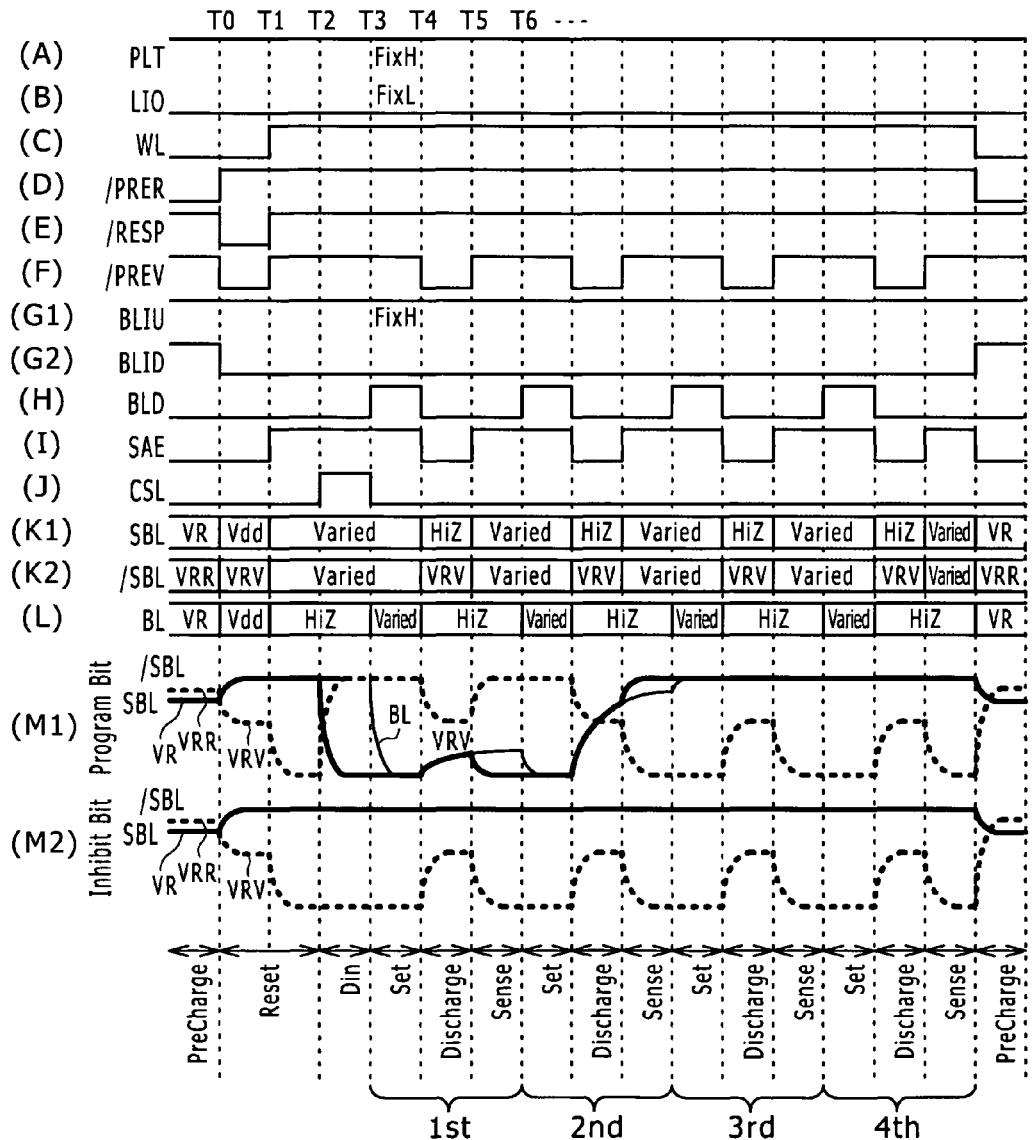
Figure 18:
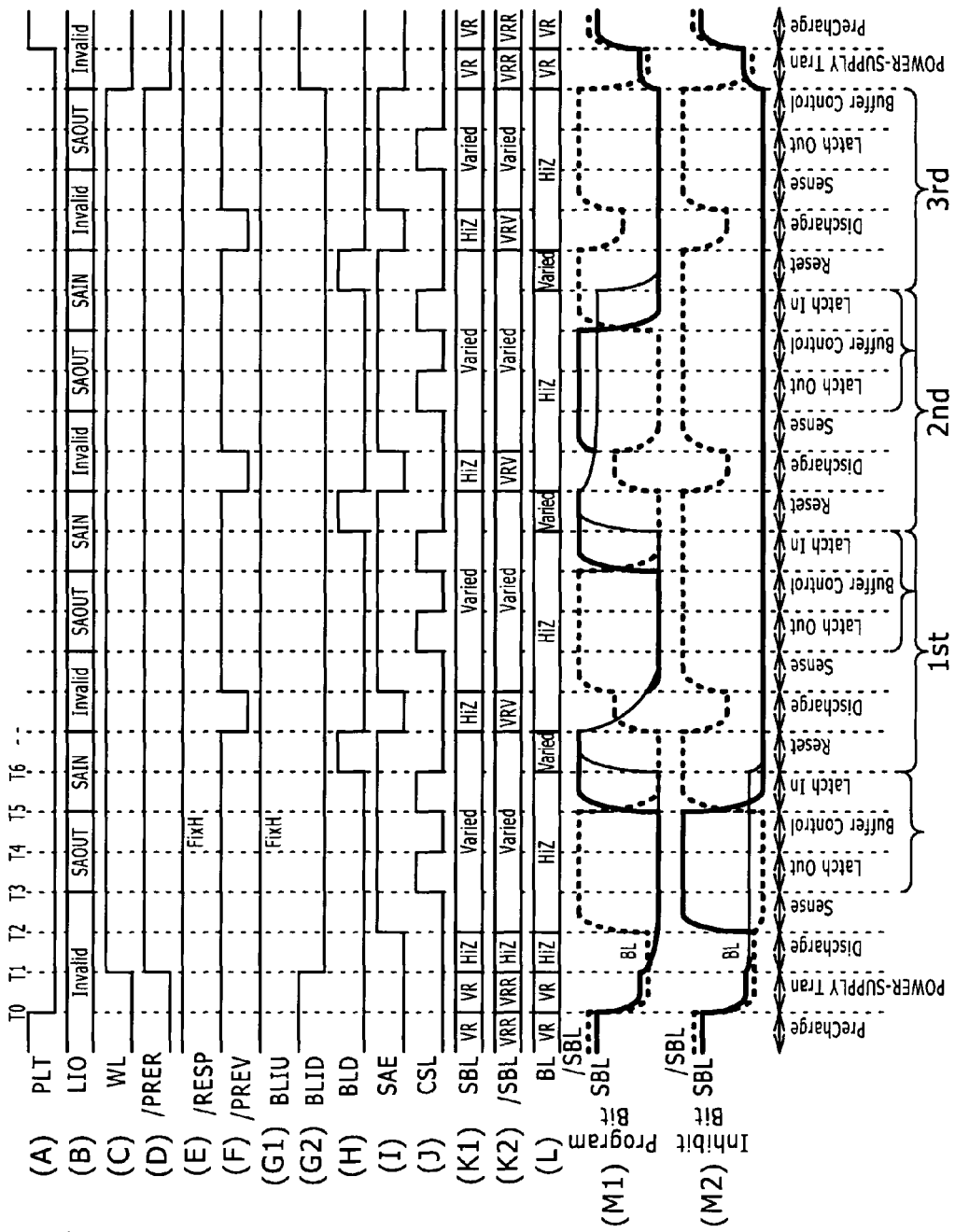
Figure 19:
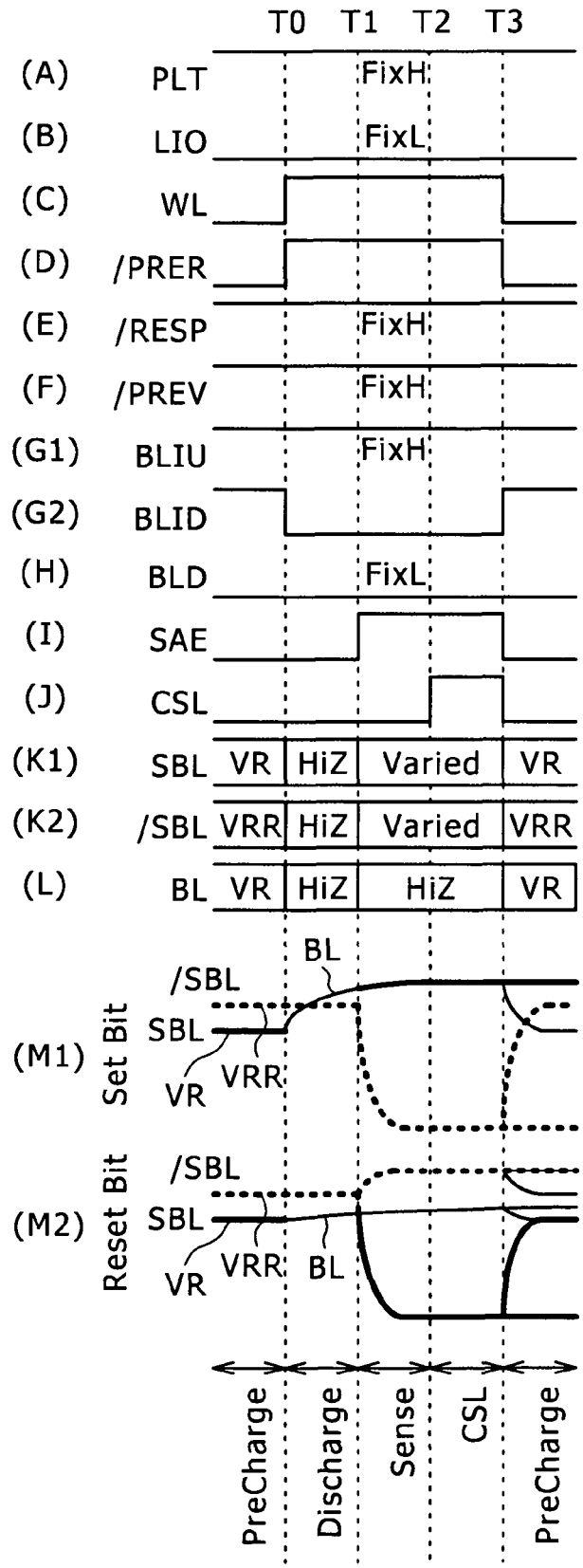

FIG. 16 is a circuit diagram showing the concrete configuration of the column circuit according to the second embodiment whereas FIGS. 17A to 17M2 are a timing diagram showing waveforms each representing a timing chart of a signal used in a data set operation which is carried out in accordance with the second embodiment. It is to be noted that the technical term 'program bit' is used in the timing diagram of FIG. 17M1 to imply the technical term 'set bit' used so far.

The column-circuit configuration shown in the circuit diagram of FIG. 16 as the column-circuit configuration employs the set driver 75A as is the case with the column-circuit configuration shown in the circuit diagram of FIG. 11 as the column-circuit configuration according to the first embodiment. However, the column-circuit configuration shown in the circuit diagram of FIG. 16 does not have the reset driver 75B employed in the column-circuit configuration shown in the circuit diagram of FIG. 11. Instead, the column-circuit configuration shown in the circuit diagram of FIG. 16 has dummy loads DL. By connecting the dummy load DL to the set driver 75A, the dummy load DL can be used as a load adjustment device for increasing a load borne by the sense bit line SBL to a magnitude equal to an increased load which is borne by the partner sense bit line /SBL.

The column-circuit configuration shown in the circuit diagram of FIG. 16 is identical with the column-circuit configuration shown in the circuit diagram of FIG. 11 except that the circuit diagram of FIG. 16 does not have the reset driver 75B, the inverter INVL and the verify latch circuit 74 which are employed in the column-circuit configuration shown in the circuit diagram of FIG. 11.

Since the waveforms shown in the waveform timing diagram of FIGS. 17A to 17M2 are all but identical with those for the first embodiment, descriptions of the waveforms shown in the waveform timing diagram of FIGS. 17A to 17M2 are eliminated in order to avoid duplications of explanations. As a result of simplifying the column-circuit configuration shown in the circuit diagram of FIG. 11 to give the column-circuit configuration shown in the circuit diagram of FIG. 16, however, the waveform timing diagram of FIGS. 17A to 17M2 shows only the waveform of a signal BLD instead of depicting the waveforms of both the signals BLDP and BLDE which are shown in the waveform timing diagram of FIGS. 12A to 12O2. In addition, since the reset driver 75B, the inverter INVL and the verify latch circuit 74 are no longer included, the waveforms of the latch signal LATCH and the latch reset signal LRES are not shown in the waveform timing diagram of FIGS. 17A to 17M2.

FIGS. 18A to 18M2 are a timing diagram showing waveforms each representing a timing chart of a signal used in the data reset operation which is carried out in accordance with the second embodiment. The waveform timing diagram of FIGS. 18A to 18M2 also shows only the waveform of a signal BLD instead of depicting the waveforms of both the signals BLDP and BLDE which are shown in the waveform timing diagram of FIGS. 13A to 13O2. In addition, since the reset driver 75B, the inverter INVL and the verify latch circuit 74 are not included, the waveforms of the latch signal LATCH and the latch reset signal LRES are not shown in the waveform timing diagram of FIGS. 18A to 18M2.

In the waveform timing diagram of FIGS. 13A to 13O2, the period of the last step in the erase cycle is referred to as a latch-set period in which a pulse of the latch signal LATCH is applied. The determination result produced in the immediately preceding direct verify sub-operation can be stored by making use of one pulse shot because the column-circuit configuration shown in the circuit diagram of FIG. 11 has the embedded verify latch circuit 74 and the embedded inverter INVL provided for the input control the verify latch circuit 74.

In the case of the second embodiment, however, this latch-set operation is carried out by a circuit provided outside the memory array. Thus, it is necessary to carry out a latch-set operation by execution of three steps. The three steps of the latch-set operation are a latch-out step, a buffer-control step and a latch-in step. In the control executed for carrying out the latch-set operation including three steps, in the case of a fail (or nonsuccess) determination result produced in the direct verify sub-operation, the execution of the buffer-control step allows data stored in the flip-flop sense latch circuit 71 to be transferred to an external destination after being read out from the flip-flop sense latch circuit 71.

The waveform timing diagram of FIGS. 18A to 18M2 shows a case in which the erase cycle including the three-step latch-set operation is repeated consecutively three times. In the last erase cycle, however, the latch-in step is not required. Thus, the latch-in step is omitted from the last erase cycle.

As described above, the second embodiment does not include the verify latch circuit 74 employed in the column-circuit configurations shown in the diagrams of FIGS. 10 and 11. As described before, the verify latch circuit 74 is used for storing information indicating whether or not the direct verify sub-operation explained in the description of the first embodiment has produced a pass (or success) result of determination at least once. Thus, the confirmed data stored in the flip-flop sense latch circuit 71 is transferred to the local input/output line LIO by applying a pulse to the column select line CSL. The data transferred to the local input/output line LIO is then passed on to a logic circuit block shown in none of the figures. Finally, processing is carried out on the transferred data and an expected value in order to execute the inhibit control based on the result of the processing.

That is to say, the data stored in the flip-flop sense latch circuit 71 is updated by executing the inhibit control to determine whether or not to apply the next reset pulse.

Since other operations are all but identical with those of the first embodiment, the other operations are not described in order to avoid duplications of explanations.

FIGS. 19A to 19M2 are a timing diagram showing waveforms each representing a timing chart of a signal used in a data read operation which is carried out in accordance with the second embodiment. The waveform timing diagram of FIGS. 19A to 19M2 also shows only the waveform of a signal BLD instead of depicting the waveforms of both the signals BLDP and BLDE which are shown in the waveform timing diagram of FIGS. 14A to 1402. In addition, since the reset driver 75B, the inverter INVL and the verify latch circuit 74 are no longer included, the waveforms of the latch signal LATCH and the latch reset signal LRES are not shown in the waveform timing diagram of FIGS. 19A to 19M2.

The data read operations themselves which are carried out in accordance with the second embodiment are identical with the data read operations carried out in accordance with the first embodiment. Thus, the data read operations carried out in accordance with the second embodiment are not described in order to avoid duplications of explanations.

Next, the following description explains a modification of the configuration of the flip-flop sense latch circuit 71 and modifications of the SA (sense amplifier) layout.

3: First Modified Version

A first modified version implements another configuration of the flip-flop sense latch circuit 71.

FIG. 20 is a circuit diagram showing the configuration of a column circuit employing a sense latch circuit 71A according to a first modified version.

The circuit diagram of FIG. 11 shows a column-circuit configuration employing the flip-flop sense latch circuit 71 having the cross-couple latch type which is a sort of the so-called flip-flop type.

On the other hand, the column-circuit configuration shown in the diagram of FIG. 20 employs a sense latch circuit 71A having a configuration different from that of the flip-flop sense latch circuit 71 to serve as a substitute for the flip-flop sense latch circuit 71. The sense latch circuit 71A employs two inverters which each have a PMOS transistor 21 and an NMOS transistor 22. The inverters are not cross-connected to each other. That is to say, the gate of the NMOS transistor 22 employed in a specific one of the two inverters is connected only to the sense bit line SBL and not connected to the output terminal of the other inverter whereas the gate of the NMOS transistor 22 employed in the other inverter is connected only to the partner sense bit line /SBL and not connected to the output terminal of the specific inverter. The sense latch circuit 71A having this type receives electric potentials appearing on the sense bit line SBL and the partner sense bit line /SBL at the gates of the two NMOS transistors 22 respectively, confirming data latched in the sense latch circuit 71A.

The type of the modified sense amplifier described above can also be adopted for the second embodiment. However, an embodiment adopting the type of the modified sense amplifier described above is shown in none of the figures.

4: Second Modified Version

A second modified version implements two typical layouts of the SAs (sense amplifiers) 7.

A MAT also referred to as an MSA (memory sub-array) includes an SA (sense amplifier) matrix which has SA rows of sense amplifiers 7. In the sense-amplifier layout shown in the diagram of FIG. 21, the bit lines BL are connected to sense amplifiers 7 alternately. To put it in detail, a bit line BL is connected to sense amplifiers 7 on the same SA column as the bit line BL every other SA row.

In the case of the sense-amplifier layout shown in the diagram of FIG. 22, on the other hand, each NMOS transistor 51 is replaced with an NMOS transistor 51A and an NMOS transistor 51B. The NMOS transistors 51A on the same row form a first system controlled by a first control signal whereas the NMOS transistors 51B on the same row form a second system controlled by a second control signal.

In either of the sense-amplifier wirings according to the second modified version, for example, the voltage driver can have a buffer configuration in place of an inverter configuration. In addition, the connection between the sense and reference nodes of the flip-flop sense latch circuit 71 can be interchanged with the connection between the set driver 75A and the reset driver 75B.

On top of that, the configuration of the verify latch circuit 74 can be changed into any one of various forms as long as the form of the configuration is a circuit configuration for holding data. In addition, it is also possible to adopt a configuration for deselecting a MAT.

In the embodiments and the modified versions which have been described above, at a data set time also referred to as a data write time, a verify sub-operation is carried out seamlessly by making use of the electric potential appearing on the bit line BL for the data set operation as a pre-charge voltage for the verify sub-operation of the data set operation. By the same token, at a data reset time also referred to as a data erase time, a verify sub-operation is carried out seamlessly by making use of the electric potential appearing on the bit line BL for a data reset operation as a pre-charge voltage for the verify sub-operation of the data reset operation. The verify sub-operation carried out seamlessly in this way is referred to as a direct verify sub-operation which gets rid of a wait time period. The wait period of time is short. If the data set operation or data reset operation including the wait time period is carried out repeatedly in a sequence including several cycles, however, the elimination of the wait time period is found very advantageous in the effort to improve the speed of the operation.

In the case of the first embodiment, the detection result of the verify sub-operation is latched in the sense amplifier 7 and, in accordance with the detection result, the inhibit control is executed for example in order to prevent a cell current from flowing in a direction of the data erase (or write) operation. To put it more concretely, the flip-flop sense latch circuit 71 employed in the sense amplifier 7 is electrically disconnected from the bit line BL. Thus, the inhibit control can be executed with a high degree of reliability. In addition, since the first embodiment can be realized by merely adding simple latch circuits and simple switches, implementation of the first embodiment incurs only a small area penalty.

On the other hand, the second embodiment is suitable for applications in which, even though the area penalty is small, the area limitation itself is strict. In such applications, the execution of the inhibit control cannot be completed only by sections provided inside the configuration of the column circuit which is created in a small area. However, a substitute for the latch circuits only can also be implemented by inversion of logic outside the configuration of the column circuit as is the case with the second embodiment.

The present application contains subject matter related to that disclosed in Japanese Priority Patent Application JP 2009-044225 filed in the Japan Patent Office on Feb. 26, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A memory device comprising a first wire, a second wire, memory cells, driving control sections, sense amplifiers, and inhibit control sections, wherein:
- each of said memory cells includes a variable-resistance storage element recording a data storage state and an access transistor connected in series to said variable-resistance storage element between said first and second wires;
- each of said driving control sections applies a write pulse or an erase pulse between said first and second wires in a data write operation or a data erase operation respectively and consecutively executes a direct verify sub-operation by causing a cell current to flow between said first and second wires through said memory cell;
- each of said sense amplifiers senses an electric-potential change occurring on said first wire in accordance with control executed by said driving control sections on said direct verify sub-operation; and
- each of said inhibit control sections determines whether or not to inhibit a sense node of said sense amplifiers from electrically changing at the next sensing time on the basis of an electric potential appearing at said sense node at the present sensing time, wherein each of said inhibit control sections include:
- a latch circuit connected to said sense node of said sense amplifiers to serve as a latch circuit configured to store binary-value information having a binary value representing a voltage sensing result indicating a sufficient or insufficient transition of said data storage state; and
- a switch for executing control to connect said sense node of said sense amplifiers to said first wire or disconnect said sense node from said first wire in accordance with said binary-value information stored in said latch circuit, wherein:
- each of said sense amplifiers is used in both a normal read operation and said direct verify sub-operation; and
- each of said inhibit control sections has a latch-input control section connected between said sense node of said sense amplifiers and said latch circuit to serve as a latch-input control section which operates to allow said binary-value information stored in said latch circuit to be updated in accordance with a voltage appearing at said sense node in said direct verify sub-operation and inhibits said binary-value information stored in said latch circuit from being updated from a value corresponding to sustainment of a turned-on state of said switch in said normal read operation.

2. The memory device according to claim 1 wherein said latch circuit has a reset section configured to reset said binary-value information stored in said latch circuit to information for initially setting said switch in said turned-on state.

3. The memory device according to claim 1 wherein each of said driving control sections has a voltage driver provided at a location in close proximity to said sense amplifiers to serve as a driver for inverting a voltage appearing at said sense node of said sense amplifiers, amplifying the inverted voltage and applying an amplified voltage to said first wire as a voltage of said write pulse or said erase pulse.

4. The memory device according to claim 1 wherein:
said memory cells are laid out to form a matrix;
a plurality of first wires and a plurality of second wires connect said memory cells to each other so as to allow a matrix driving operation to be carried out on said memory cells;
each of said sense amplifiers is provided for a plurality of columns of said matrix;
in a memory array including said memory cells, with each column of said memory array of said memory cells laid out in a column direction, each of said sense amplifiers is provided for said plurality of said columns; and
each of said driving control sections and each of said inhibit control sections are provided for said plurality of said columns.

5. The memory device according to claim 1 wherein each of said inhibit control sections include:
- a first control section provided at a location in close proximity to said sense amplifiers to serve as a control section configured to carry out an operation to apply an additional write or erase pulse for causing said cell current to flow again in accordance with a held voltage obtained as a result of amplification performed by said sense amplifiers; and
- a second control section configured to inhibit an electrical change from occurring at said sense node of said sense amplifiers by letting a voltage held by said sense amplifiers be output and inverted, returning said the inverted voltage to said sense amplifiers and controlling an operation carried out by said first control section to apply said additional write or erase pulse.

6. The memory device according to claim 5 wherein said first control section is a voltage driver provided at a location in close proximity to said sense amplifiers to serve as a driver for inverting a voltage appearing at said sense node of said sense amplifiers, amplifying said inverted voltage appearing at said sense node of said sense amplifiers and applying said amplified voltage to said first wire as a voltage of said write pulse or said erase pulse.

7. The memory device according to claim 5 wherein:
said memory cells are laid out to form a matrix;
a plurality of first wires and a plurality of second wires connect said memory cells to each other so as to allow a matrix driving operation to be carried out on said memory cells;
each of said sense amplifiers is provided for a plurality of columns of said matrix;
in a memory array including said memory cells, with each column of said memory array of said memory cells laid out in a column direction, each of said sense amplifiers is provided for said plurality of said columns; and
each of said driving control sections and each of said inhibit control sections are provided for said plurality of said columns.

8. The memory device according to claim 1 wherein said sense amplifiers has a configuration in which a voltage appearing on said first wire as a voltage having a magnitude varying in accordance with said cell current is latched and amplified by a flip-flop.

9. The memory device according to claim 1 wherein said sense amplifiers has a configuration in which a voltage appearing on said first wire as a voltage having a magnitude varying in accordance with said cell current is supplied to the gate of an NMOS-type or PMOS-type transistor for sensing and amplifying said voltage supplied to said gate.

10. The memory device according to claim 1 wherein said sense amplifiers has a wire isolation switch for disconnecting said sense node of said sense amplifiers from said first wire when amplifying an electric potential appearing at said sense node.

11. The memory device according to claim 10 wherein said wire isolation switch is created from an NMOS-type transistor, a PMOS-type transistor or a transfer gate including an NMOS-type transistor and a PMOS-type transistor which are connected in parallel to each other.

12. The memory device according to claim 1 wherein:
said variable-resistance storage element has two electrodes;
between said two electrodes, an ion supplying layer is superposed on a storage layer to form a laminated body;
said storage layer is made of an insulation material; and
said ion supplying layer includes at least one of Cu, Ag and Zn and at least one of S, Se and Te.

* * * * *